(12) United States Patent
Katou et al.

(10) Patent No.: US 8,721,788 B2
(45) Date of Patent: May 13, 2014

(54) METHOD FOR CHARGING WITH LIQUEFIED AMMONIA, METHOD FOR PRODUCING NITRIDE CRYSTAL, AND REACTOR FOR GROWTH OF NITRIDE CRYSTAL

(75) Inventors: Yuuichi Katou, Iwaki (JP); Takao Watanabe, Kitakyushu (JP); Kazunori Hiruta, Saitama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 1022 days.

(21) Appl. No.: 12/681,517

(22) PCT Filed: Sep. 24, 2008

(86) PCT No.: PCT/JP2008/067172
§ 371 (c)(1), (2), (4) Date: May 26, 2010

(87) PCT Pub. No.: WO2009/044651
PCT Pub. Date: Apr. 9, 2009

(65) Prior Publication Data
US 2010/0294195 A1    Nov. 25, 2010

(30) Foreign Application Priority Data

Oct. 5, 2007 (JP) .................. 2007-262751
Oct. 5, 2007 (JP) .................. 2007-262752

(51) Int. Cl.
*C30B 7/10* (2006.01)
(52) U.S. Cl.
USPC ............... 117/68; 117/70; 117/75; 117/78; 117/79
(58) Field of Classification Search
USPC ................... 117/68, 70, 75, 78, 79
See application file for complete search history.

(56) References Cited

FOREIGN PATENT DOCUMENTS

| JP | 7 243712 | 9/1995 |
|---|---|---|
| JP | 9-273837 | 10/1997 |
| JP | 2001 271998 | 10/2001 |
| JP | 2003 44146 | 2/2003 |
| JP | 2005 8444 | 1/2005 |
| JP | 2005-289797 | 10/2005 |
| JP | 2006-342043 | 12/2006 |
| JP | 2007-111693 | 5/2007 |
| JP | 2007-511357 | 5/2007 |
| JP | 2009-102174 | 5/2009 |
| WO | WO 2005/049170 A1 | 6/2005 |

OTHER PUBLICATIONS

Japanese Office Action issued Apr. 3, 2012 in Patent Application No. 2007-266123 with English Translation.

(Continued)

*Primary Examiner* — Bob M Kunemund
(74) *Attorney, Agent, or Firm* — Oblon, Spivak, McClelland, Maier & Neustadt, L.L.P.

(57) ABSTRACT

A method for charging with liquefied ammonia comprising sequentially a feeding step of feeding gaseous ammonia in a condenser, a liquefaction step of converting the gaseous ammonia into a liquefied ammonia in the condenser, and a charging step of feeding the liquefied ammonia formed in the condenser to a vessel to thereby charge the vessel with the liquefied ammonia wherein a cooling step of feeding the liquefied ammonia formed in the condenser to the vessel and cooling the vessel by the latent heat of vaporization of the liquefied ammonia and a circulation step of feeding the gaseous ammonia formed through vaporization of the liquefied ammonia in the previous cooling step to the condenser are carried out between the liquefaction step and the charging step.

25 Claims, 9 Drawing Sheets

(56) References Cited

OTHER PUBLICATIONS

Japanese Office Action issued Oct. 25, 2011, in Patent Application No. 2007-266123 (with English-language translation).
Japanese Written Opinion of the International Searching Authority issued May 14, 2010, in Patent Application No. PCT/JP2008/067172, filed Sep. 24, 2008 (with English-language translation).
R. Dwiliński, et al., "GaN Synthesis by Ammonothermal Method", Acta Physica Polonica A, vol. 88, No. 5, Nov. 1995, pp. 833-836.
Joseph W. Kolis, et al., "Crystal growth of gallium nitride in supercritical ammonia", Journal of Crystal Growth, vol. 222, Jan. 2001, pp. 431-434.
X.L. Chen[a], et al., "Synthesis and structure of nanocrystal-assembled bulk GaN", Journal of Crystal Growth, vol. 209, Jan. 2000, pp. 208-212.
Taro Shimomitsu, "Liquefied Ammonia Organic Chemistry", GIHODO Co., Ltd., Aug. 15, 1957, pp. 8-11, 320 (with partial English translation).

METHOD FOR CHARGING WITH LIQUEFIED AMMONIA, METHOD FOR PRODUCING NITRIDE CRYSTAL, AND REACTOR FOR GROWTH OF NITRIDE CRYSTAL

TECHNICAL FIELD

The present invention relates to a method for charging with liquefied ammonia, and to a method of using it for producing nitride crystals, in particular to a method for producing high-quality bulk crystals of a nitride of an element of Group 13 of the Periodic Table (hereinafter referred to as "Group 13 element") such as typically gallium nitride. The invention also relates to a vessel for growth of nitride crystals, which is used in carrying out the method for producing nitride crystals.

BACKGROUND ART

Gallium nitride (GaN) is useful as a substance applicable to electronic devices such as light-emitting diodes, laser diodes, etc. For producing gallium nitride crystals, at present, a vapor-phase epitaxial growth method on a substrate such as sapphire, silicon carbide or the like according to an MOCVD (metal-organic chemical vapor deposition) method is the most popular. However, according to the method, GaN crystals are heteroepitaxially grown on a substrate that differ from GaN in the lattice constant and the thermal expansion coefficient, and therefore, the method is problematic in that the GaN crystals to be formed therein may often involve dislocation and lattice defect and the crystals could hardly have the quality applicable to blue laser, etc.

Recently, therefore, it has become strongly desired to establish a novel technique, which is substitutable for the above-mentioned method, for producing high-quality bulk single crystals of gallium nitride for homoepitaxial substrates. As one of such novel production methods for gallium nitride crystals, a solution growth method for a nitride using ammonia as a solvent (so-called ammonothermal method) has been proposed. R. Dwilinski, et al. have obtained gallium nitride crystals using $KNH_2$ as a mineralizing agent for crystallization in a solvent of supercritical ammonia under a high pressure of from 100 to 500 MPa (see Non-Patent Reference 1). Kolis, et al. have obtained gallium nitride crystals using $KNH_2$ and KI as a mineralizing agent for crystallization in a solvent of supercritical ammonia under a high pressure of 240 MPa (see Non-Patent Reference 2). Chen, et al. have obtained gallium nitride crystals using $NH_4Cl$ as a mineralizing agent for crystallization in a solvent of supercritical ammonia under a high pressure of about 200 MPa in a Pt-lined reactor (see Non-Patent Reference 3).

In these production methods for gallium nitride crystals, a pressure reactor (for example, autoclave or the like) is first cooled and then charged with ammonia after cooled. As the method for charging a reactor with ammonia, for example, there is known a method of cooling a reactor with an external coolant such as liquid nitrogen, methanol with dry ice or the like and charging the reactor with gaseous ammonia being condensed (for example, see Patent References 1 and 2). However, these cooling methods are problematic in that the charging accuracy is low. In addition, when they are applied to a large-scale reactor, the whole pressure vessel having a large calorific capacity must be cooled from its outside, and therefore the methods are disadvantageous in point of the cost for cooling equipment, mobile equipment, etc.

Also known is a method of charging a vessel directly with liquefied ammonia (for example, see Non-Patent Reference 4). According to the method, the vessel can be cooled by the latent heat of vaporization of liquefied ammonia being charged therein. Accordingly, it is unnecessary to previously cool the vessel, and the vessel may be charged with ammonia at room temperature. However, in direct charging with ammonia that is liquid, the purity of ammonia may lower owing to the impurities existing in ammonia.

Also known is a method of charging with ammonia by a plunger pump. However, the method requires high-pressure equipment and could hardly enhance the charging accuracy. Further, there is a high possibility of contamination of ammonia with impurities from pumps and pipelines, and it is difficult to increase the purity of the ammonia charged in vessels.

Patent Reference 1: JP-A 2005-289797
Patent Reference 2: JP-A 9-273837
Non-Patent Reference 1: R. Dwilinski, et al., ACTA PHYSICA POLONICA A, Vol. 88 (1995), p. 833
Non-Patent Reference 2: Kolis, et al., J. Crystal Growth 222 (2001), p. 431
Non-Patent Reference 3: Chen, et al., J. Crystal Growth 209 (2000), p. 208
Non-Patent Reference 4: Taro Shimomitsu, Liquefied Ammonia Organic Chemistry, Giho-do (1957)

DISCLOSURE OF THE INVENTION

Problems that the Invention is to Solve

As described in the above, the conventional methods of charging with ammonia have many problems to be solved in point of the energy and the cost in application to large-scale reactors. In particular, an ammonothermal method for producing nitride crystals is readily applicable to large-scale furnaces, and therefore requires a high charging accuracy.

In an ammonothermal for producing nitride crystals, for example, a large-scale furnace of more than 12 tons having an inner capacity of 110 liters may be used. Such a large-scale furnace to be a pressure reactor is difficult to move, and is not suitable for cooling with a cooling tank. In addition, the large-scale furnace shall have a large calorific capacity by itself and therefore requires much energy for cooling. Even in the case of using such a large-scale furnace, a method is desired for safely, efficiently and accurately charging the furnace with high-purity ammonia.

In the method for producing nitride crystals, the charging accuracy of ammonia into the reactor is important. This is because the crystal growth pressure for nitride crystals is determined by the ammonia charging rate and the temperature; and for example, when the charging rate changes by 1%, then the crystal growth pressure changes by about 4.5 MPa. Accordingly, when the reactor could not be charged with ammonia with high accuracy, then the ultimate pressure inside the reactor is difficult to estimate and the running condition is therefore difficult to optimize.

To solve these problems, an object of the present invention is provide a method of charging with liquefied ammonia in which high-purity ammonia can be charged in a reactor with high accuracy, and a method of using it for producing nitride crystals, and a reactor for nitride crystal growth for use in the nitride crystal production method.

Means for Solving the Problems

The above-mentioned objects can be attained by the invention mentioned below.

[1] A method for charging with liquefied ammonia comprising sequentially:
 a feeding step of feeding gaseous ammonia in a condenser,
 a liquefaction step of converting the gaseous ammonia into a liquefied ammonia in the condenser,
 and a charging step of feeding the liquefied ammonia formed in the condenser to a vessel to thereby charge the vessel with the liquefied ammonia;
 wherein the following process group (A) is carried out between the liquefaction step and the charging step, or the following process group (B) is carried out after the charging step, or both the two process groups are carried out:
 a cooling step of feeding the liquefied ammonia formed in the condenser to the vessel and cooling the vessel by the latent heat of vaporization of the liquefied ammonia,
 and a circulation step of feeding the gaseous ammonia formed through vaporization of the liquefied ammonia in the previous cooling step to the condenser;
 a metering step of metering the total ammonia amount M1 existing inside the ammonia-charging apparatus and the ammonia amount M2 existing inside the ammonia-charging apparatus except the vessel, under the condition of stopping the running of the liquefied ammonia in and out of the vessel, and
 a charging amount-controlling step of discharging the liquefied ammonia out of the vessel in an amount corresponding to the difference (M1−M2−MC) between the difference (M1−M2) between M1 and M2 metered in the previous metering step, and the programmed liquefied ammonia-charging amount (MC) in the vessel.

[2] The liquefied ammonia charging method of [1], wherein the vessel has a feed port for feeding the liquefied ammonia thereinto and a discharge port for discharging the gaseous ammonia out of the vessel.

[3] The liquefied ammonia charging method of [1] or [2], wherein the vessel has one transfer port for feeding the liquefied ammonia and discharging the gaseous ammonia out of the vessel.

[4] The liquefied ammonia charging method of any one of [1] to [3], comprising:
 a feeding step of feeding gaseous ammonia to a condenser,
 a liquefaction step of converting the gaseous ammonia into liquefied ammonia in the condenser,
 a cooling step of feeding the liquefied ammonia formed in the condenser to a vessel and cooling the vessel by the latent heat of vaporization of the liquefied ammonia,
 a circulation step of feeding the gaseous ammonia formed through vaporization of the liquefied ammonia in the previous cooling step to the condenser, and
 a charging step of feeding the liquefied ammonia formed in the condenser to the vessel to thereby charge the vessel with the liquefied ammonia.

[5] The liquefied ammonia charging method of [4], wherein in the feeding step, the gaseous ammonia feeding amount is metered with a mass flow meter.

[6] The liquefied ammonia charging method of [5], wherein in the feeding step, the gaseous ammonia feeding amount is controlled in accordance with the data metered with the mass flow meter.

[7] The liquefied ammonia charging method of any one of [4] to [6], comprising a discharging step of discharging excessive gaseous ammonia out of the system.

[8] The liquefied ammonia charging method of [7], wherein in the discharging step, the gaseous ammonia discharging amount is metered with a mass flow meter.

[9] The liquefied ammonia charging method of any one of [4] to [8], wherein the gaseous ammonia liquefying speed in the condenser in the liquefaction step is lower than the liquefied ammonia vaporization speed in the cooling step.

[10] The liquefied ammonia charging method of any one of [1] to [9], comprising:
 a feeding step of feeding gaseous ammonia to a condenser,
 a liquefaction step of converting the gaseous ammonia into liquefied ammonia in the condenser,
 a charging step of feeding the liquefied ammonia formed in the condenser to the vessel to thereby charge the vessel with the liquefied ammonia,
 a metering step of metering the total ammonia amount M1 existing inside the ammonia-charging apparatus and the ammonia amount M2 existing inside the ammonia-charging apparatus except the vessel, under the condition of stopping the running of the liquefied ammonia in and out of the vessel, and
 a charging amount-controlling step of discharging the liquefied ammonia out of the vessel in an amount corresponding to the difference (M1−M2−MC) between the difference (M1−M2) between M1 and M2 metered in the previous metering step, and the programmed liquefied ammonia-charging amount (MC) in the vessel.

[11] The liquefied ammonia charging method of [10], wherein the total ammonia amount M1 existing inside the ammonia-charging apparatus is determined by metering the total ammonia amount (Min) fed into the ammonia-charging apparatus and the total ammonia amount (Mout) discharged out of the ammonia-charging apparatus, and computing the difference therebetween (Min−Mout).

[12] The liquefied ammonia charging method of [10] or [11], wherein the ammonia amount M2 existing inside the ammonia-charging apparatus except the vessel is metered with discharging the ammonia existing in the region of the ammonia-charging apparatus except the vessel, out of the ammonia-charging apparatus.

[13] The liquefied ammonia charging method of any one of [10] to [12], wherein the ammonia-charging apparatus is equipped with a first mass flow meter for metering the gaseous ammonia-introducing amount into the apparatus.

[14] The liquefied ammonia charging method of [13], wherein the total ammonia amount (Min) fed into the ammonia-charging apparatus is metered with the first mass flow meter.

[15] The liquefied ammonia charging method of any one of [10] to [14], wherein the ammonia-charging apparatus is equipped with a second mass flow meter for metering the gaseous ammonia discharging amount out of the apparatus.

[16] The liquefied ammonia charging method of [15], wherein the total ammonia amount (Mout) discharged out of the ammonia-charging apparatus is metered with the second mass flow meter.

[17] The liquefied ammonia charging method of [15] or [16], wherein the ammonia amount discharged out of the vessel in the charging amount controlling step is metered with the second mass flow meter.

[18] The liquefied ammonia charging method of any one of [10] to [17], wherein in the charging step, the vessel is cooled by the latent heat of vaporization of the liquefied ammonia with feeding the liquefied ammonia formed in the condenser into the vessel.

[19] The liquefied ammonia charging method of [18], wherein the gaseous ammonia formed through vaporization is discharged out of the ammonia-charging apparatus.

[20] The liquefied ammonia charging method of [18], wherein the gaseous ammonia formed through vaporization is circulated into the condenser.

[21] The liquefied ammonia charging method of [20], wherein gaseous ammonia is not additionally fed into the ammonia-charging apparatus during the circulation.
[22] A method for producing nitride crystals, comprising:
an ammonia-charging step of charging a vessel containing a starting material therein, with liquefied ammonia according to the liquefied ammonia charging method of any one of [1] to [21], and
a crystallization step of heating the vessel charged with liquefied ammonia in the previous ammonia charging step, to thereby form nitride crystals.
[23] The production method for nitride crystals of [22], wherein in the crystallization step, at least the vessel is kept under from 20 to 500 MPa.
[24] The production method for nitride crystals of [22] or [23], wherein in the crystallization step, at least the vessel is heated up to from 150 to 800° C.
[25] The production method for nitride crystals of any one of [22] to [24], comprising a step of adding at least one additive to the vessel.
[26] The production method for nitride crystals of [25], wherein the additive contains at least one halogen atom.
[27] The production method for nitride crystals of any one of [22] to [26], wherein the oxygen content of the starting material is at most 5% by mass.
[28] The production method for nitride crystals of any one of [22] to [27], wherein the starting material contains gallium nitride.
[29] The production method for nitride crystals any one of [22] to [28], wherein at least one seed crystal is put in the vessel and, in the crystallization step, the starting material dissolved in ammonia is precipitated out on the seed crystal.
[30] A pressure-resistant and closable reactor for growth of nitride crystals,
which has at least two valved transfer means.

Advantageous Effects of the Invention

According to the invention, there are provided a method of charging with liquefied ammonia in which high-purity ammonia can be charged in a reactor with high accuracy, and a method of using it for producing nitride crystals, and a reactor for nitride crystal growth for use in the nitride crystal production method.

Figure 1:
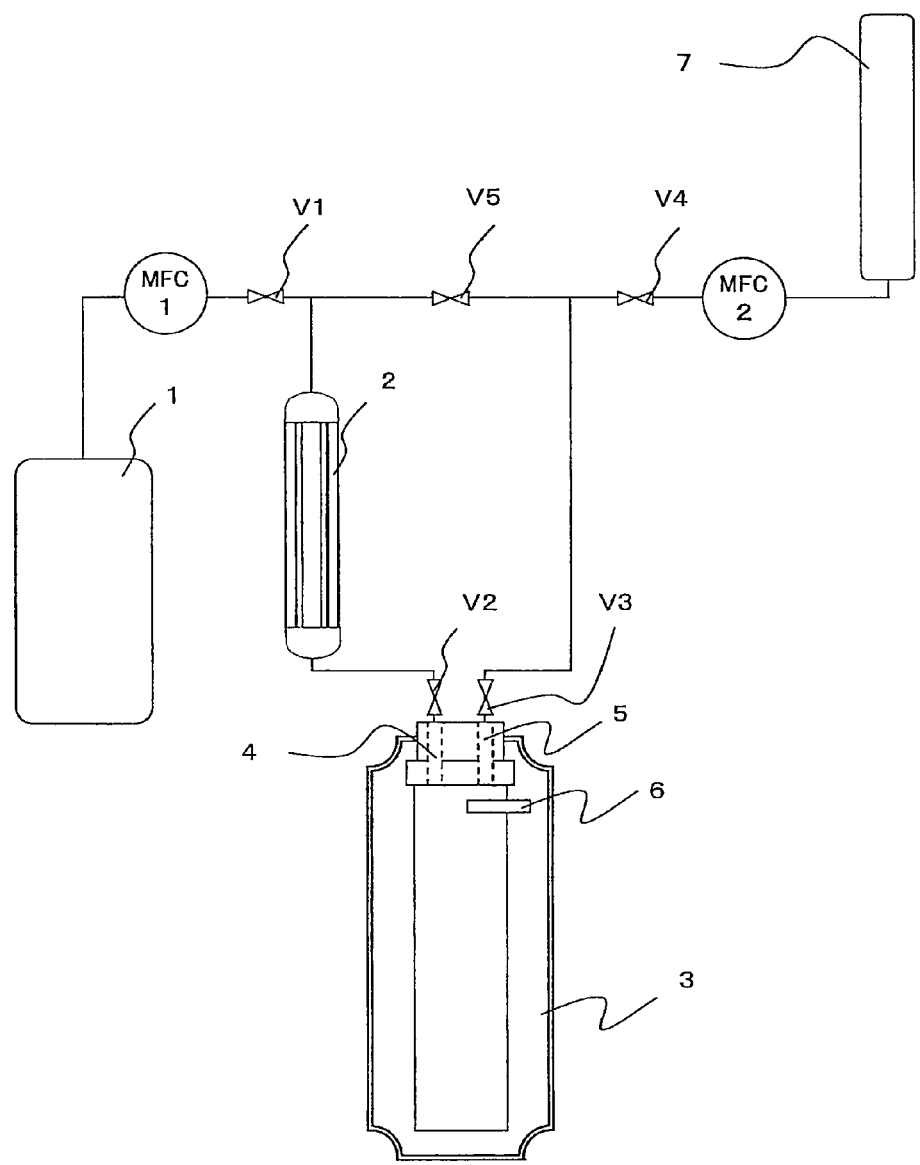
FIG. 1 This is an outline view showing a liquefied ammonia charging apparatus for use in the invention.

In the drawings, 1 is an ammonia cylinder, 2 is a condenser, 3 is an autoclave, 4 is an ammonia feed port, 5 is an ammonia discharge port, 6 is a sensor, 7 is an ammonia removing tower, is a control unit, 9 is an electric furnace, 10 is a thermocouple, 3A is a crystal growing part, 3B is a starting material charging part.

BEST MODE FOR CARRYING OUT THE INVENTION

The production method and the production apparatus for nitride crystals of the invention are described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.
(1) Characteristics and Application of the Liquefied Ammonia Charging Method of the Invention:
The liquefied ammonia charging method of the invention comprises sequentially a feeding step of feeding gaseous ammonia in a condenser, a liquefaction step of converting the gaseous ammonia into a liquefied ammonia in the condenser, and a charging step of feeding the liquefied ammonia formed in the condenser to a vessel to thereby charge the vessel with the liquefied ammonia, as the indispensable steps. The method is characterized in that a process group (A) comprising a cooling step of feeding the liquefied ammonia formed in the condenser to the vessel and cooling the vessel by the latent heat of vaporization of the liquefied ammonia, and a circulation step of feeding the gaseous ammonia formed through vaporization of the liquefied ammonia in the previous cooling step to the condenser is carried out between the liquefaction step and the charging step; or a process group (B) comprising a metering step of metering the total ammonia amount M1 existing inside the ammonia-charging apparatus and the ammonia amount M2 existing inside the ammonia-charging apparatus except the vessel, under the condition of stopping the running of the liquefied ammonia in and out of the vessel, and a charging amount-controlling step of discharging the liquefied ammonia out of the vessel in an amount corresponding to the difference (M1−M2−MC) between the difference (M1−M2) between M1 and M2 metered in the previous metering step, and the programmed liquefied ammonia-charging amount (MC) in the vessel is carried out after the filling step; or these process group (A) and process group (B) are both carried out. Most preferably, both the process group (A) and the process group (B) are carried out.
(1-1) Characteristics of the Charging Method Including the Process Group (A):
In the liquefied ammonia charging method of the invention, gaseous ammonia is first fed to the condenser to form liquefied ammonia therein for cooling the vessel, and then the liquefied ammonia is fed to the vessel. The liquefied ammonia vaporizes in the vessel, and the vessel is cooled by the resulting latent heat. In the charging method including the process group (A), the gaseous ammonia formed through vaporization in the vessel is again fed to the condenser. In the charging method including the process group (A), a constant amount of ammonia is circulated in the system and the vessel is cooled from the inside thereof, and therefore, the method is characterized in that the vessel can be efficiently cooled with a small amount of ammonia.

When the vessel is cooled lower than the boiling point of ammonia (about −33° C. under normal pressure), then liquefied ammonia could not vaporize in the vessel, and therefore the vessel begins to be charged with liquefied ammonia. The ammonia to be charged into the vessel is naturally fed as a vapor in the previous feeding step, and therefore as compared with a case where liquefied ammonia is directly charged into the vessel, it is contaminated with few impurities such as $H_2O$, CO, metal, etc. Accordingly, in the liquefied ammonia charging method of the invention, high-purity ammonia can be charged in the vessel.

According to the liquefied ammonia charging method of the invention, a predetermined amount of gaseous ammonia is once fed into a condenser in the feeding step, and the liquefied ammonia formed in the condenser is accumulated. With that, the accumulated ammonia is circulated to cool the vessel, and finally the vessel is filled with the liquefied ammonia. The system of the invention may be so designed that the gaseous ammonia feeding amount is metered with a mass flow meter in the feeding step. Accordingly, the ammonia amount to be fed into the system can be metered, not influenced by the pressure and the temperature of the gaseous ammonia. In accordance with the data metered by the mass flow meter, the gaseous ammonia feeding amount may be controlled.

In the cooling step, preferably, the gaseous ammonia liquefying speed in the condenser is higher than the liquefied ammonia vaporization speed. This can be attained, for example, by installing a shell-and-tube type condenser (heat exchanger) between the mass flow controller MFC1 and the autoclave.

(1-2) Characteristics of the Charging Method Including the Process Group (B):

In the charging method including the process group (B), gaseous ammonia is first fed to the condenser to form liquefied ammonia, which is then fed to the vessel. The ammonia to be charged into the vessel is naturally fed as a vapor into the vessel, and therefore as compared with a case where liquefied ammonia is directly charged into the vessel, it is contaminated with few impurities such as $H_2O$, CO, metal, etc. Accordingly, in the method of the invention including the process group (B), high-purity ammonia can be charged in the vessel.

In the embodiment including the process group (B), the total ammonia amount M1 existing inside the ammonia-charging apparatus and the ammonia amount M2 existing inside the ammonia-charging apparatus except the vessel are metered in the metering step after the vessel is filled with liquefied ammonia. Preferably, these are metered with a first mass flow meter capable of controlling and metering the gaseous ammonia amount of be fed to the condenser (the gaseous ammonia amount to be fed to the ammonia-charging apparatus), and a second mass flow meter capable of controlling and metering the gaseous ammonia amount to be discharged out of the ammonia-charging apparatus. Using the mass flow meter, the ammonia amount can be metered not influenced by the pressure and the temperature of the gaseous ammonia.

The total ammonia amount M1 existing inside the ammonia-charging apparatus can be determined by metering the total ammonia amount fed into the ammonia-charging apparatus (Min) and the total ammonia amount discharged out of the ammonia-charging apparatus (Mout), followed by computing the difference therebetween (Min−Mout). Preferably, the ammonia amount M2 existing inside the ammonia-charging apparatus except the vessel is determined by closing the valve of the vessel after the vessel has been charged with gaseous ammonia, and then metering the gaseous ammonia remaining in the region of the ammonia-charging apparatus except the vessel (that is, inside the pipelines and the condenser) with all discharging it under suction, using the second mass flow mater.

In the embodiment including the process group (B), the metering step is followed by the charging amount-controlling step of discharging the liquefied ammonia out of the vessel in an amount corresponding to the difference (M1−M2−MC) between the difference (M1−M2) between M1 and M2 metered in the previous metering step, and the programmed liquefied ammonia-charging amount (MC) in the vessel. In this step, preferably, the second mass flow meter is so set that the gaseous ammonia amount to be discharged out of the ammonia-charging apparatus via the second mass flow meter from the vessel could be (M1−M2−MC). The embodiment including the process group (B) to be effected in that controlled manner makes it possible to charge the vessel with gaseous ammonia with high accuracy.

(1-3) Application of the Liquefied Ammonia Charging Method of the Invention:

The liquefied ammonia charging method of the invention including at least one of the process group (A) or the process group (B) is favorable for a production method for nitride crystals. Concretely, the method is favorably applied to a production method for nitride crystals using a pressure vessel (autoclave) according to an ammonothermal method. The production method for nitride crystals of the invention, to which the liquefied ammonia charging method of the invention is applied, comprises an ammonia-charging step of charging a vessel containing a starting material therein, with liquefied ammonia according to the liquefied ammonia charging method of the invention, and a crystallization step of heating the vessel charged with liquefied ammonia in the previous ammonia charging step, to thereby form nitride crystals. In the production method for nitride crystals of the invention, the vessel can be efficiently cooled according to the liquefied ammonia charging method of the invention, and therefore the vessel can be charged with high-purity ammonia with high accuracy, and consequently, the pressure in crystal growth in forming nitride crystals can be well controlled with accuracy. Accordingly, the ultimate temperature inside the vessel can be controlled, and therefore the running condition can be regulated and the safety of the apparatus and the process can be thereby enhanced.

(2) Embodiment of the Liquefied Ammonia Charging Method:

(2-1) Liquefied Ammonia Charging Apparatus:

A production method for nitride crystals according to the liquefied ammonia charging method of the invention is described below with reference to the drawings. The invention should not be limited to this embodiment. FIG. 1 is an outline view showing a liquefied ammonia-charging apparatus for use in the invention. As in FIG. 1, the liquefied ammonia-charging apparatus comprises an ammonia cylinder 1, a condenser 2, and a pressure-resistant autoclave (reactor) 3. The autoclave 3 has an ammonia feed port 4, an ammonia discharge port 5, and a sensor 6 for monitoring the temperature and/or the pressure inside the autoclave. Further, the liquefied ammonia-charging apparatus in FIG. 1 is equipped with an ammonia removing tower 7 for discharging ammonia out of the system.

The ammonia cylinder 1 is charged with liquefied ammonia. From the ammonia cylinder 1, gaseous ammonia is fed into the system. As in FIG. 1, a mass flow controller (mass flow meter) MFC1 is disposed between the ammonia cylinder 1 and the condenser 2. The mass flow controller is a mass-metering device in which the ambient temperature and pressure are taken into consideration; and based on the thermal diffusion effect of gaseous ammonia, the device can meter and integrate a gaseous ammonia flow rate irrespective of fluctuation in temperature and pressure of gaseous ammonia. By controlling the opening of the mass flow controller MFC1, the flow rate of gaseous ammonia can be controlled. Accordingly, the mass flow controller MFC1 can be so designed that it is closed at the time when the necessary amount of gaseous ammonia has been fed to the system. Preferably, the mass flow controller has a high flow rate accuracy, and for example, has a flow rate accuracy of ±1%. As the mass flow controller of the type, for example, Kofloc's Model 3200 may be used here.

Between the ammonia cylinder 1 and the condenser 2, disposed is an off/on valve V1; and when the valve is opened, then gaseous ammonia can be fed to the condenser 2.

The condenser 2 is a device in which the gaseous ammonia fed from the ammonia cylinder 1 via the mass flow controller MFC1 and the valve V1 is condensed to give liquefied ammonia. In general, a cylinder such as the ammonia cylinder 1 or the like contains impurities such as moisture, oil, metal and the like having a lower degree of volatility than that of ammonia. Consequently, once vaporizing ammonia into gaseous ammonia can increase the purity of the ammonia to be fed into the system.

As the condenser 2, herein usable is an ordinary condenser that is generally used for condensing a vapor for liquefaction thereof. In the condenser 2, for example, the vapor may be cooled, condensed and liquefied with a heat exchanger. In this, when the pressure is increased, then the liquefaction is easy.

Between the condenser 2 and the autoclave 3, provided is a control valve V2; and by controlling the degree of opening and closing the valve, the liquefied ammonia amount to be fed into the autoclave 3 via the ammonia feed port 4 can be controlled.

The autoclave 3 is provided with a starting material therein, and after cooled according to the liquefied ammonia charging method of the invention, this is charged with liquefied ammonia. Further, after charged with liquefied ammonia, this is heated, and nitride crystals are formed inside it. The details of the autoclave 3 and the starting material to be provided therein are described hereinafter. In the invention, gaseous ammonia may be charged into the vessel not provided with a starting material therein.

The autoclave 3 has two openings, an ammonia feed port 4 through which liquefied ammonia is fed from the condenser 2, and an ammonia discharge port 5 for discharging the gaseous ammonia formed in the autoclave 3. The autoclave 3 is equipped with a sensor 6 capable of monitoring the temperature and/or the pressure inside the autoclave 3.

As in FIG. 1, the pipeline connected to the ammonia discharge port 5 of the autoclave 3 is branched on the way into a pipeline connected to the condenser 2 for the purpose of again liquefying the gaseous ammonia so as to feed it into the autoclave 3, and a pipeline connected to the ammonia removing tower 7 for discharging the gaseous ammonia out of the system. Between the autoclave 3 and the ammonia removing tower 7, disposed are a valve V3, a valve V4 and a mass flow controller MFC2; and in the pipeline connected to the condenser 2 for again feeding the gaseous ammonia into the autoclave 3, disposed is a valve V5. As the ammonia removing tower 7, here suitably usable is any known ammonia removing tower.

The valve V3 is a control valve, and by controlling the degree of its opening and closing, the flow rate of the gaseous ammonia to be discharged out of the autoclave 3 can be controlled. Consequently, the pressure in the system after the valve V3 can be thereby controlled. In case where pressure control is not needed, the valve may be kept completely open. The valve V4 is an on/off valve, and when it is opened, the gaseous ammonia can be discharged out of the system via the mass flow controller MFC2. The mass flow controller MFC2 controls, meters and integrates the flow rate of the gaseous ammonia discharged out into the ammonia removing tower 7 via the valve V4. Therefore, the mass flow controller MFC2 may be so programmed that it is closed at the time when a predetermined amount of gaseous ammonia is discharged out. As the mass flow controller MFC2, usable is the same device as that of the above-mentioned mass flow controller MFC1.

Figure 2:
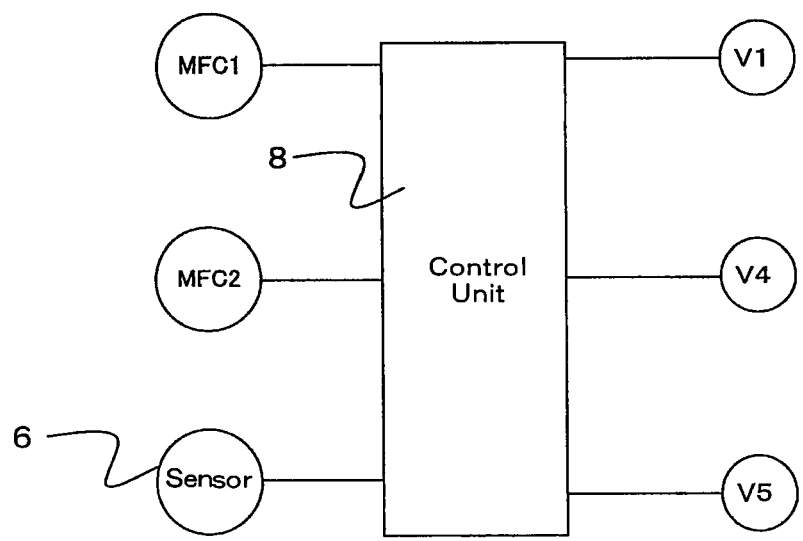
FIG. 2 This is a block diagram showing the electrical constitution of valves V1 to V5, mass flow controllers MFC1 and MFC2 and a sensor 6.

Coordinating with the other valves V1 and V4, the valve V5 is opened or closed so as to make ammonia circulate inside the system to cool the autoclave 3. As in FIG. 2, the valves V1, V4 and V5, the mass flow controllers MFC1 and MFC2, and the sensor 6 are electrically connected to a control unit 8. FIG. 2 is a block diagram showing the electrical constitution of the valves V1, V4 and V5, the mass flow controllers MFC1 and MFC2, and the sensor 6.

As in FIG. 2, the valves V1, V4 and V5 are connected to the control unit 8, and the system is so designed that, according to the signal transmitted by the control unit 8, the valves are controlled to be opened and closed. The mass flow controller MFC1 and MFC2 and the sensor 6 (especially a pressure sensor) are connected to the control unit 8, and the system is so designed that the control unit can receive the data measured in the devices and can control the opening and closing of the valves according to the data. For example, when the pressure data monitored by the sensor 6 is over a defined value, then the valve V4 and the mass flow controller MFC2 are opened to thereby control the system so that the pressure in the system may not be too high.

The valves V2 and V3 not connected to the control unit 8 are manual valves (for example, needle valves), and are hand-operated for controlling the dropwise addition of liquefied ammonia to the vessel and the discharge of gaseous ammonia out of the vessel so as not to be too rapid. However, all the valves V1 to V5 may be connected to the control unit 8, and the data monitored by the sensor 6 serving as a temperature sensor may be utilized for controlling the system. These modifications may be suitably made by those skilled in the art within their self-obvious range.

(2-2) Embodiment of the Charging Method Including the Process Group (A):

The liquefied ammonia charging method of the invention includes a feeding step of feeding gaseous ammonia to the condenser 2, a liquefaction step of liquefying the gaseous ammonia in the condenser 2, a cooling step of cooling the autoclave 3 by the latent heat of vaporization of the liquefied ammonia, a circulation and cooling step of feeding the gaseous ammonia formed in the autoclave 3 to the condenser for again liquefying it, and a charging step of charging the liquefied ammonia into the cooled autoclave 3. The charging step may run parallel to the cooling step and/or the circulation step. In the following description, the expression of "charging step" shall include a case where the charging step runs parallel to the cooling step and/or the circulation step.

The steps are described hereinunder with reference to the drawings.

Figure 3:
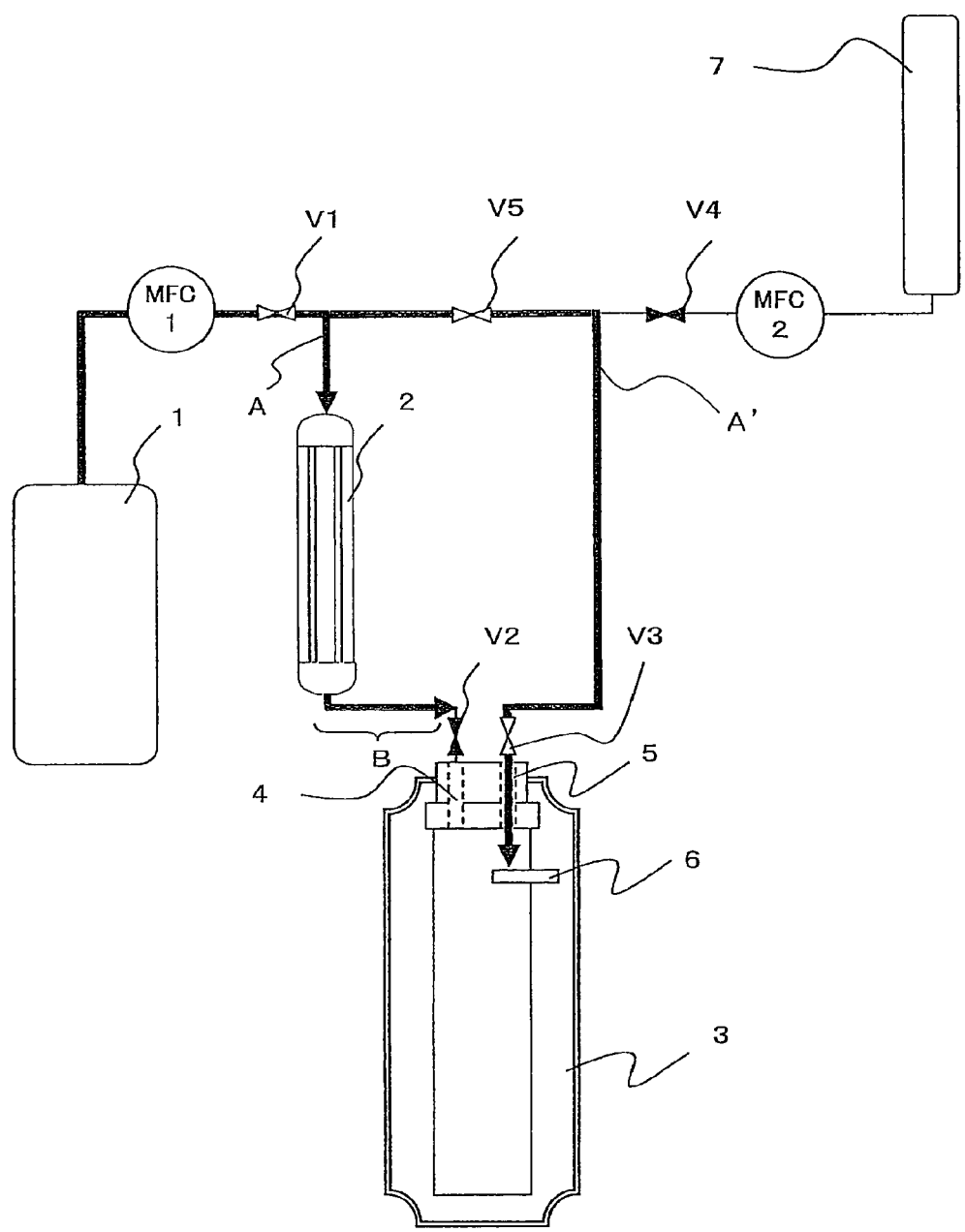
FIG. 3 This is an outline view showing a valve opening and closing condition in the feeding step of a circulation method.

With reference to FIG. 3, the flow route of ammonia in the feeding step is described. FIG. 3 is an outline view showing a valve opening and closing condition in the feeding step. As in FIG. 3, in the feeding step, at least the valve V2 and the valve V4 are closed. In the feeding step, the valve V1 and the mass flow controller MFC1 that were closed at the start are opened whereby the gaseous ammonia discharged out of the ammonia cylinder 1 is fed to the condenser 2 along the flow line shown by A in FIG. 3. In addition, the gaseous ammonia is also fed to the autoclave 3 via the valve V5 and the valve V3 along the flow line shown by A' in FIG. 3. After the system has reached a steady state, the flow shown by A in FIG. 3 is the main route of the gaseous ammonia. The feeding amount of the gaseous ammonia in the feeding step is previously set in the mass flow controller MFC1, and at the time when a predetermined feeding amount has been fed to the system, the controller may be closed. The flow rate of the gaseous ammonia in the feeding step is preferably not over the liquefaction capacity of the condenser 2. The flow rate of the gaseous ammonia may be controlled by the mass flow controller MFC1.

The gaseous ammonia fed to the condenser 2 is condensed in the condenser 2 to be liquefied ammonia, which is then accumulated between the valve V2 and the condenser 2 (B in FIG. 3). The accumulation of the liquefied ammonia is continued until the flow amount metered by the mass flow controller MFC1 reaches the predetermined value. In this stage, the amount of the liquefied ammonia to be accumulated may be determined in consideration of the necessary amount for the growth of crystals and also the charging regulation level and the in-pipeline remaining amount thereof.

Figure 4:
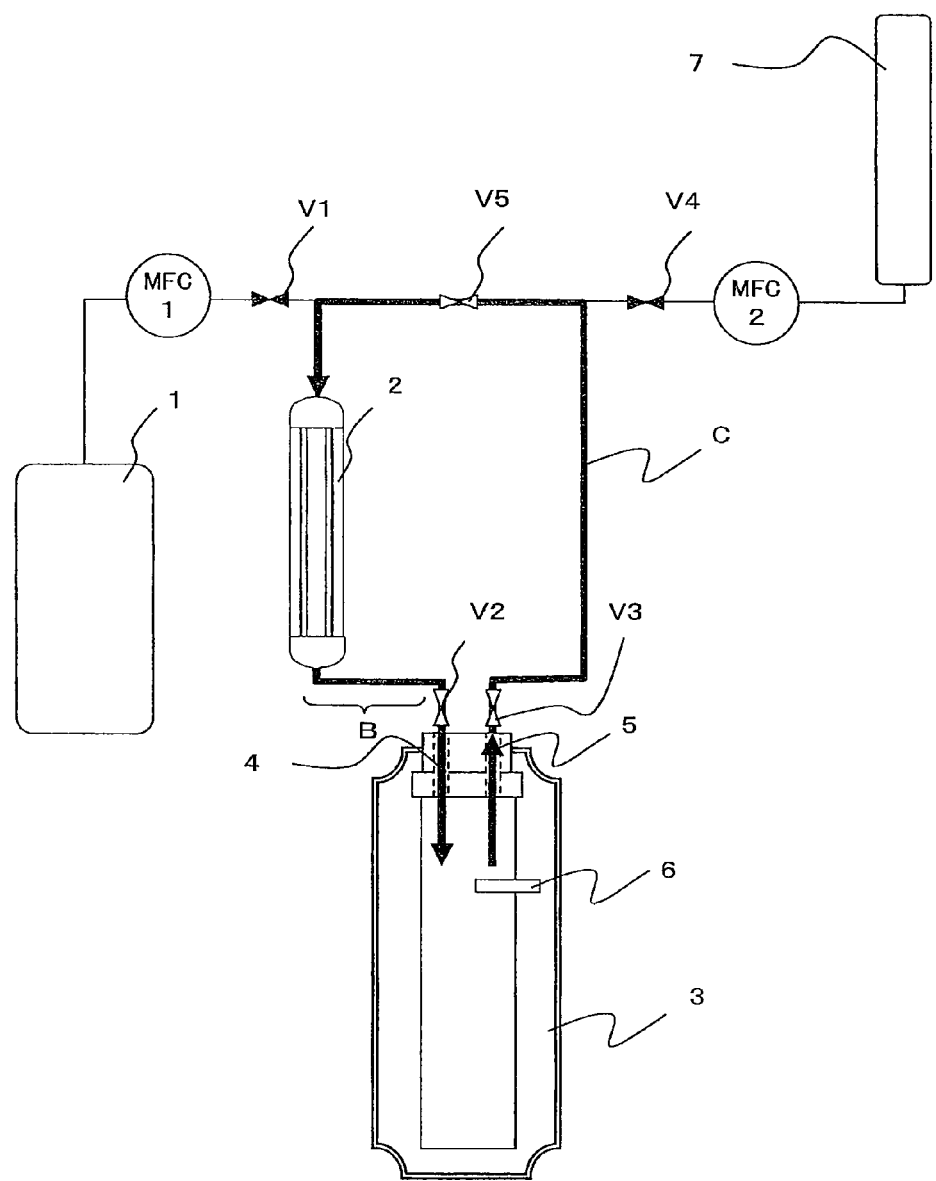
FIG. 4 This is an outline view showing a valve opening and closing condition in the circulation and cooling step of a circulation method.

Next, with reference to FIG. 4, the flow route of ammonia in the circulation and cooling step (cooling step and circulation step) is described. FIG. 4 is an outline view showing a valve opening and closing condition in the circulation and cooling step. By the direction of the control unit 8 to finish the feeding step and to start the circulation and cooling step, the valve V1 and the valve V4 are closed, and the valves V3 and V5 are opened. The valve V2 is closed before the start of the circulation and cooling step. In the circulation and cooling step, the valve V2 is first gradually opened, and liquefied ammonia is fed into the autoclave 3 via the ammonia feed port 4. In this stage, preferably, the opening and closing condition is so controlled that the pressure inside the system could be at most 0.2 MPaG.

The liquefied ammonia fed into the autoclave 3 immediately vaporizes, and by the latent heat thereof, the autoclave 3 is gradually cooled. In that manner, according to the liquefied ammonia charging method of the invention, the autoclave (reactor) 3 is cooled inside it, and therefore the autoclave 3 can be cooled efficiently.

In the autoclave 3, the gaseous ammonia formed through vaporization of the liquefied ammonia is discharged out through the ammonia discharge port 5; and along the flow shown by C in FIG. 4, this is fed to the condenser 2, passing through the valve V5. The gaseous ammonia thus fed to the condenser 2 is again liquefied, and is again fed to the autoclave 3. Accordingly, the supply of the liquefied ammonia from the side of the condenser 2 to the autoclave 3 and the supply of the gaseous ammonia from the side of the autoclave 3 to the condenser 2 are cycled in a well balanced manner. The ammonia cycle cools the autoclave 3.

When the autoclave 3 is cooled to the boiling point of ammonia under the charging pressure, then liquefied ammonia begins to be charged in the autoclave 3. Accordingly, the process runs from the circulation and cooling step to the charging step. Concretely, the boiling point of ammonia is about −19° C. when the pressure inside the autoclave 3 is 0.1 MPaG, and is about −9° C. when the pressure is 0.2 MPaG. When the autoclave 3 is cooled to −10° C. or so, then the vapor pressure of ammonia lowers, and most of ammonia accumulated in the liquefaction step is charged in the autoclave 3. Accordingly, in case where the charging pressure inside the autoclave 3 is set at 0.2 MPa, the temperature of the autoclave 3 is confirmed to reach −10° C. and the valves V2 and V3 are closed, and the charging with ammonia is finished.

As in the above, according to the invention including the process group (A), the vessel (autoclave 3) can be cooled with a small amount of ammonia, and can be charged with high-purity ammonia with high accuracy. According to the liquefied ammonia charging method of the invention, the vessel is cooled inside it, and the cooling efficiency is high. In the liquefied ammonia charging method of the invention, the autoclave can be charged with ammonia under low pressure, and therefore the pressure latitude in planning the autoclave applicable to the invention may be on an ordinary plant pressure level, and the invention has another advantage in point of the safety thereof.

(2-3) Embodiment of the Charging Method Including the Process Group (B):

In the liquefied ammonia charging method including the process group (B) of the invention, the charging step is followed by the metering step and the charging amount-controlling step.

Figure 5:
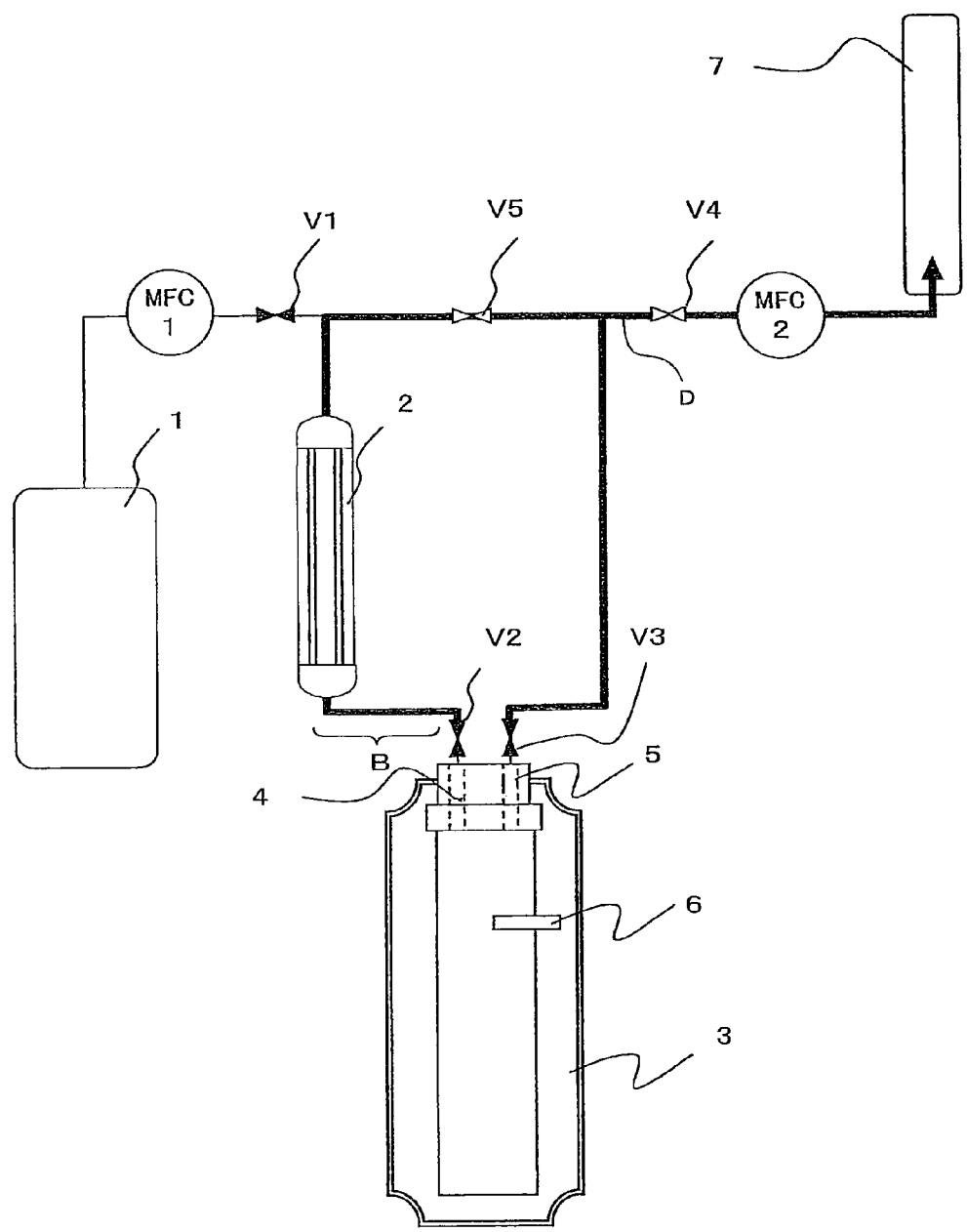
FIG. 5 This is an outline view showing a valve opening and closing condition before the controlling step.

In the metering step, the valves V1, V2 and V3 and the mass flow controller MFC1 are closed and the valves V4 and V5 and the mass flow controller MFC2 are opened, the gaseous ammonia is discharged out along the flow of D, as in FIG. 5. For completely discharging the gaseous ammonia, the flow is sucked by a vacuum pump from the discharge side of the mass flow controller MFC2. The suction may be effected after the flow amount through the mass flow controller MFC2 is lowered. The discharging amount of the gaseous ammonia is metered by the mass flow controller MFC2, and this is the amount of ammonia remaining in the condenser 2 and the pipeline (that is, the ammonia amount M2 existing in the ammonia-charging apparatus except the autoclave 3). The ammonia amount M2 existing in the ammonia-charging apparatus except the autoclave 3 is readily influenced by the temperature of the ammonia-charging apparatus and by the chiller temperature, and is readily fluctuated, and therefore, the liquefied ammonia charging amount in the charging step is preferably so defined as to include the fluctuation. The total ammonia amount fed into the ammonia-charging apparatus up to the charging step can be known by confirming the gaseous ammonia amount having passed through the mass flow controller MFC1, and this may be the total ammonia amount M1 existing in the ammonia-charging apparatus.

Next, in the charging amount-controlling step, (M1−M2) is computed from the data of M1 and M2 metered in the metering step 2, thereby giving the liquefied ammonia amount charged in the autoclave 3. The difference between the value and the programmed charging amount (MC), (M1−M2−MC) is the liquefied ammonia amount excessively charged in the autoclave 3, and therefore in the charging amount-controlling step, the liquefied ammonia corresponding to (M1−M2−MC) is discharged out of the autoclave 3. In a narrow sense, the gaseous ammonia amount existing between the mass flow controller MFC1 and the valve V1 must be further subtracted from (M1−M2−MC), and the thus computed amount must be discharged out of the autoclave 3; however, the gaseous ammonia amount existing between the mass flow controller MFC1 and the valve V1 can be substantially ignorable by shortening the distance between the mass flow controller MFC1 and the valve V1. Alternatively, the gaseous ammonia amount existing between the mass flow controller MFC1 and the valve V1 is previously estimated, and the value may be subtracted from (M1−M2−MC) to give the ammonia amount that is to be discharged out of the autoclave 3. This modification is also within the scope of the invention.

Figure 6:
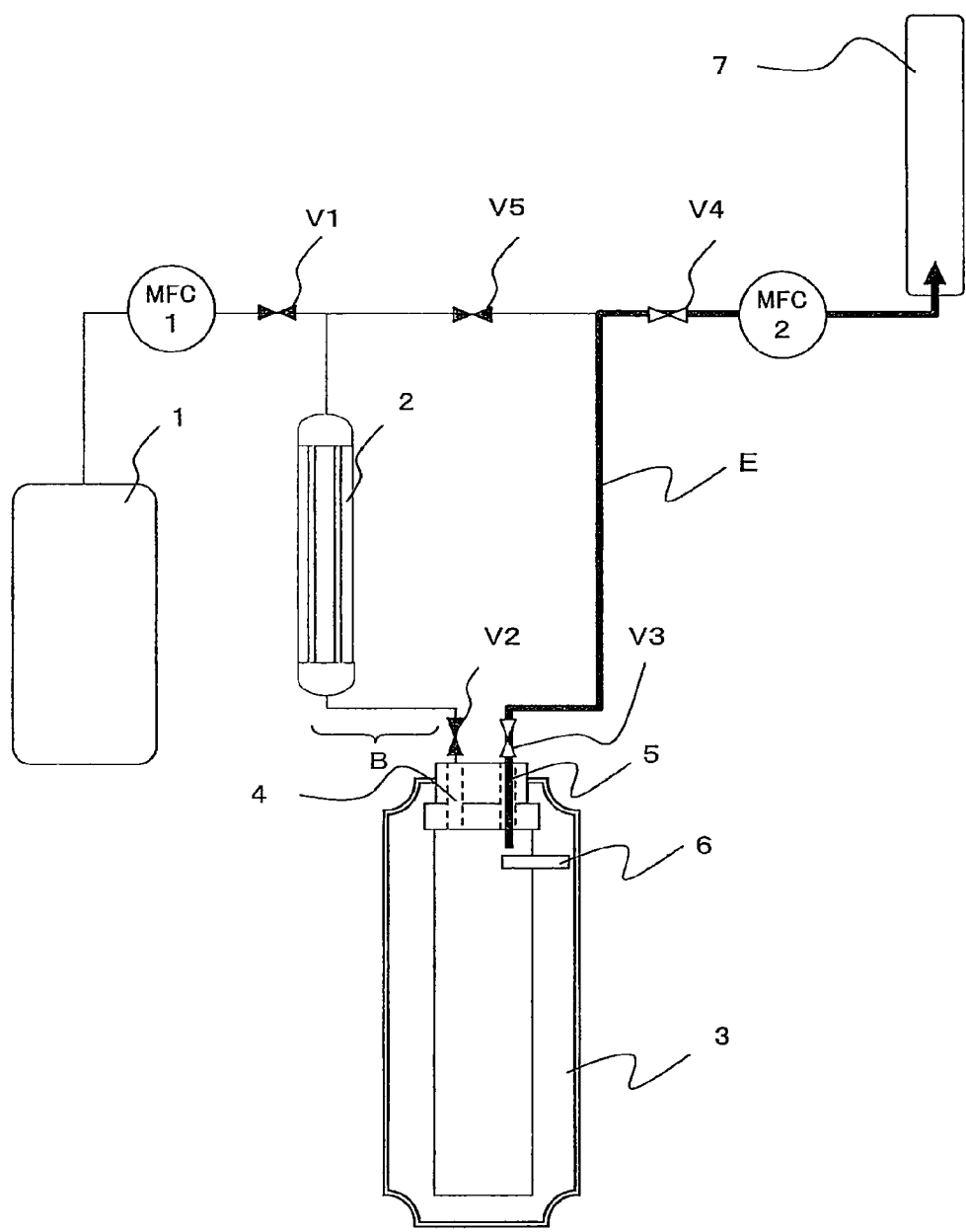
FIG. 6 This is an outline view showing a valve opening and closing condition during the controlling step.

FIG. 6 is an outline view showing a valve opening and closing condition in the charging amount-controlling step. At the start of the charging amount-controlling step, the valves V1, V2 and V5 and the mass flow controller MFC1 are closed, and the valves V3 and V4 and the mass flow controller MFC2 are opened. With that, the gaseous ammonia in the autoclave 3 is discharged out into the ammonia removing tower 7 along the flow of E as in FIG. 6, and is absorbed by water and collected. The control unit 8 meters the gaseous ammonia amount discharged out of the system by the mass flow controller MFC2, and by the direction of the control unit 8 to determine that the previously programmed excessive amount of ammonia (M1−M2−MC) has been discharged out, the valves V3 and V4 are closed and the controlling step is finished.

In the charging method including the process group (B) of the invention, the so-called circulation method of the process group (A) may be omitted. For example, in place of the circulation method, a flow method may be combined with the process group (B) in carrying out the method of the invention. The flow method differs from the circulation method in the valve opening and closing condition in the charging step, but is the same as the circulation method in the feeding step, the liquefaction step, the metering step and the charging amount-controlling step.

Figure 8:
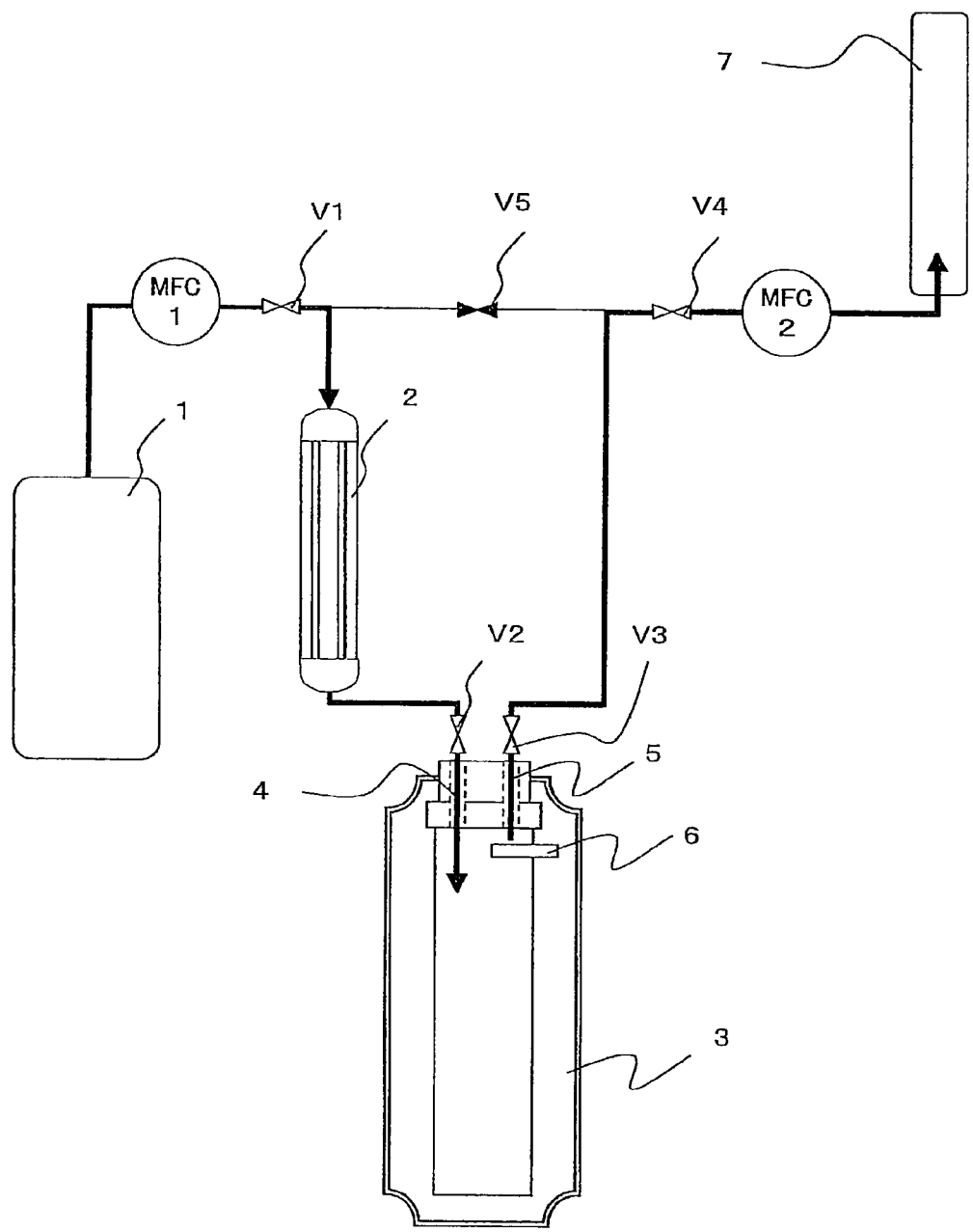
FIG. 8 This is an outline view showing a valve opening and closing condition in the feeding step of a flow method.

FIG. 8 is a view showing a valve opening and closing condition in the feeding step of the flow method. In the feeding step of the flow method, liquefied ammonia is fed into the autoclave 3 and the autoclave 3 is cooled by the latent heat of vaporization thereof and charged with the liquefied ammonia, and the gaseous ammonia formed in the autoclave 3 is discharged out of the ammonia-charging apparatus. Specifically, in the charging step, the valves V3 and V4 and the mass flow controller MFC2 are kept open to secure the discharge line, and the valve V2 is gradually opened to thereby feed the liquefied ammonia into the autoclave 3 via the ammonia feed port 4.

The liquefied ammonia fed into the autoclave 3 immediately vaporizes and the autoclave 3 is gradually cooled by the latent heat thereof. In the autoclave 3, the gaseous ammonia formed through vaporization of the liquefied ammonia is charged out via the ammonia discharge port, and along the flow shown in FIG. 8, this passes through the valve V4 and the mass flow controller MFC2 and is led to the ammonia removing tower 7. The mass flow controller MFC1 and the valves V1 and V2 are previously opened in the feeding step and the liquefaction step, and therefore the liquefied ammonia is continuously fed to the autoclave 3 via these and through the ammonia feed port 4. In this stage, preferably, the mass flow controller MFC1 and the mass flow controller MFC2 are kept at the same flow rate, and the liquefied ammonia amount accumulated between the valve V2 and the condenser 2 is kept always constant. When the autoclave 3 is cooled to the boiling point of ammonia under the charging pressure, then the autoclave 3 begins to be charged with liquefied ammonia. At the time when a larger amount than the programmed amount (MC) is charged into the autoclave, the valves V2 and V3 are closed, and the charging with ammonia is finished.

After the charging, the method is followed by the metering step and the charging amount-controlling step, like the circulation step. However, the total ammonia amount M1 existing in the ammonia-charging apparatus is computed by subtracting the ammonia discharging amount metered by the mass flow controller MFC2 from the ammonia charging amount metered by the mass flow controller MFC1.

As in the above, according to the charging method including the process group (B) of the invention, the vessel can be charged with high-purity ammonia with high accuracy. Further, according to the liquefied ammonia charging method of the invention, the vessel is cooled from the inside thereof, and therefore the cooling efficiency is high. In the liquefied ammonia charging method of the invention, the autoclave can be charged with ammonia under low pressure, and therefore the pressure latitude in planning the autoclave applicable to the invention may be on an ordinary plant pressure level, and the invention has another advantage in point of the safety thereof. Moreover, when the process group (B) is combined with the process group (A) in the circulation method, then the vessel (autoclave 3) can be cooled with a smaller amount of ammonia with good efficiency. Further, when the process group (B) is combined with the flow method, then the charging may be readily attained in a more simplified operation.

Figure 7:
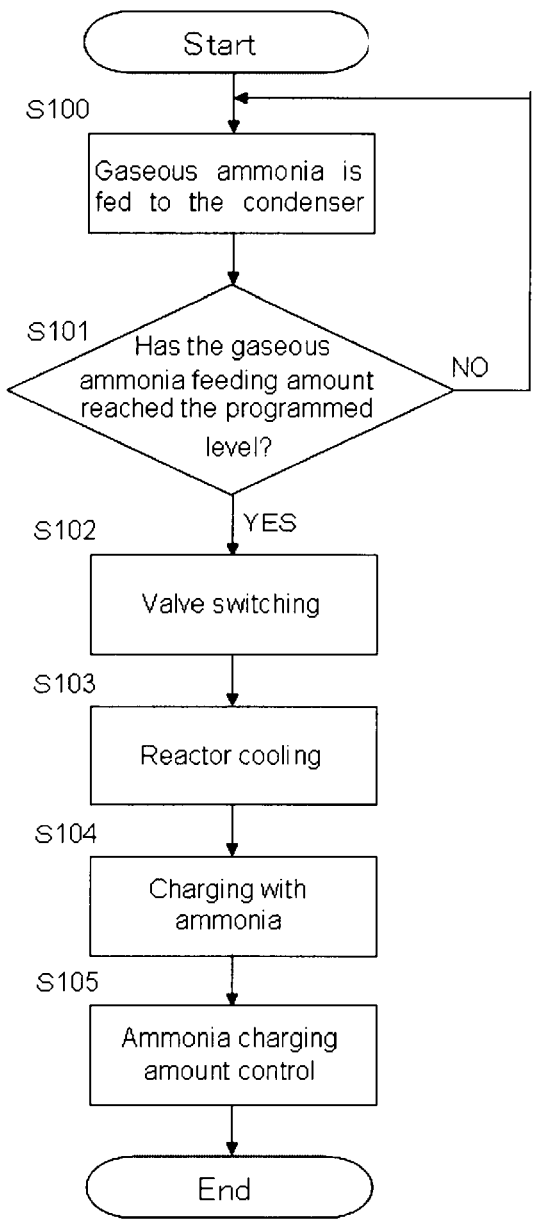
FIG. 7 This is a flowchart for explaining the liquefied ammonia charging method of the invention.

(2-4) Description of Flowchart:

One preferred example of the flow of the liquefied ammonia charging method of the invention is described with reference to FIG. 7. FIG. 7 is a flowchart for explaining the liquefied ammonia charging method of the invention. First, the control unit controls the arrangement of the valves for the feeding step (at least the valves V2 and V4 are closed) for the purpose of accumulating the liquefied ammonia in the feeding step and the liquefaction step. After the control unit 8 has controlled the valves, gaseous ammonia is gradually fed to the condenser 2 by opening and closing the valve V1 (step S100).

Next, the control unit 8 checks the gaseous ammonia feeding amount monitored by the mass flow controller MFC1 as to whether or not the amount has reached the programmed level (step S101). In case where the control unit 8 has judged the gaseous ammonia feeding amount not to reach the programmed level (step S101, NO), the treatment of the step S100 is repeated and gaseous ammonia is fed to the condenser 2. On the other hand, in case where the control unit 8 has judged the gaseous ammonia feeding amount to have reached the programmed level (step S101, YES), then the flowchart goes on to the step S102, in which the valves are turned to the arrangement in the circulation and cooling step (the valves V1 and V4 are closed, and the valves V2, V3 and V5 are opened) (step S102). The valve V2 is closed before the start of the circulation and cooling step.

In the circulation and cooling step, ammonia is circulated and the autoclave 3 is cooled by the latent heat of vaporization of liquefied ammonia (step S103). Next, when the autoclave 3 is cooled to the boiling point of ammonia, then the vaporization of ammonia stops, and the autoclave 3 is charged with liquefied ammonia (step S104). In this stage, cooling the autoclave 3 and charging it with liquefied ammonia may go on simultaneously. After the charging amount has reached the desired level (for example, when the control unit 8 has judged the temperature of the autoclave 3 has reached −10° C.), the valves V2 and V3 are closed, and the charging step is finished. After the charging step, the valves V1 to V3 are closed, and the ammonia amount remaining in the pipeline and in the condenser is metered by suction with a vacuum pump from the side of the mass flow controller MFC2. Based on the metered amount and the data metered by the mass flow controllers MFC1 and MFC2, the ammonia amount to be discharged out of the autoclave 3 is computed, and the amount is set in the mass flow controller MFC2. The valves are regulated to be in the arrangement in the charging amount controlling step (the valves V1, V2 and V5 are closed, and the valves V3 and V4 are opened), and the excessive ammonia in the autoclave 3 is discharged out through the ammonia removing tower 7 (step S105).

(3) Production Method for Nitride Crystals:

Next described are the starting material, the solvent and the vessel for use in the production method for nitride crystals of the invention, and the nitride crystals obtained in the invention with reference to the drawings.

Figure 9:
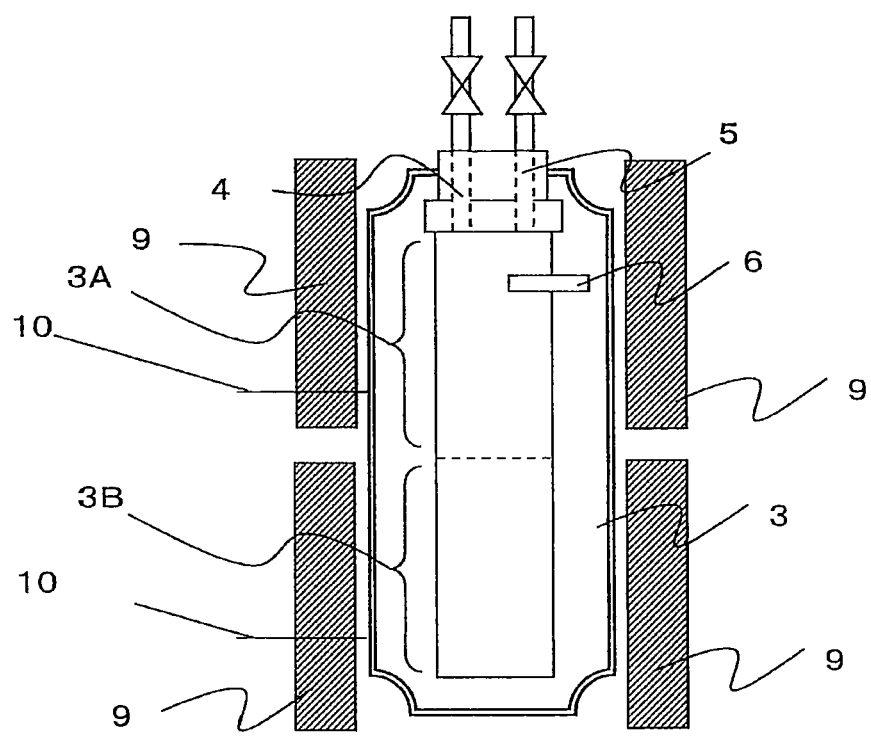
FIG. 9 This is an outline view of an autoclave for use in the nitride crystal production method of the invention.

FIG. 9 is an outline view of an autoclave for use in the nitride crystal production method of the invention. The autoclave shown in FIG. 9 is the same type as that of the autoclave 3 used in FIG. 1, etc., and the same reference numerals are given to the same parts and their description is omitted. As in FIG. 9, the autoclave 3 comprises a crystal growing part 3A and a stating material charging part 3B, and though not shown in FIG. 1 and others, this is surrounded by an electric furnace 9. The autoclave 3 for use in the liquefied ammonia charging method of the invention (reactor for growth of nitride crystals) is a pressure-resistant closable vessel having at least one valved transfer means (transfer port). Preferably, the autoclave ahs one or two transfer means (transfer ports). In case where the autoclave has one transfer means, a circulating current is formed inside the autoclave whereby charging with liquefied ammonia and discharging of gaseous ammonia can be bettered. For forming the circulating current, the inner diameter of the transfer port is preferably larger. In case where the autoclave has two transfer means (ammonia feed port 4 and ammonia discharge port 5), charging with liquefied ammonia and discharging of gaseous ammonia can be attained even though a circulating current is not formed inside the autoclave. In particular, in case where the inner diameter of the transfer port is small, the autoclave preferably has two transfer means.

The structure of the autoclave 3 is described. In general, the autoclave is divided into a cap and a body, and is sealed up with a gasket or the like. It may have a recess through which a thermocouple or the like is inserted thereinto.

Preferably, the autoclave 3 is resistant to pressure corresponding to the ultrahigh pressure of a supercritical solvent (for example, supercritical ammonia) during heating reaction therein. Not specifically defined, the material to form the autoclave may be any one resistant to pressure and resistant to corrosion. Preferred are Ni-based alloys and Co-based alloys such as Stellite (registered trade mark by Deloro Stellite Company Incorporated) or the like resistant to high temperature and high pressure and highly resistant to corrosion by ammonia; and more preferred are Ni-based alloys. Concrete materials include Inconel 625 (Inconel is a registered trade mark by Huntington Alloys Canada Limited—the same shall apply hereinunder), Nimonic 90 (Nimonic is a registered trade mark by Special Metals Wiggin Limited—the same shall apply hereinunder), RENE 41, etc.

The composition ratio of these alloys may be suitably selected and determined depending on the temperature and pressure condition of the solvent in the autoclave, on the reactivity and/or the oxidation power and reduction power with the above-mentioned various mineralizing agents and their reaction products to be in the autoclave, and on the pH condition. For using these as the material to constitute the inner face of the autoclave, there may be employed a method of producing the autoclave itself with the alloy, or a method of forming a thin film of the alloy as an inner cylinder and installing it inside the autoclave, or a method of plating the inner face of the autoclave 3 formed of any other material with the alloy.

For enhancing the corrosion resistance of the autoclave 3, the inner surface of the autoclave 3 may be lined or coated with a noble metal taking advantage of the excellent corrosion resistance of the noble metal. The material itself of the autoclave may be a noble metal. The noble metal includes Pt, Au, Ir, Ru, Rh, Pd, Ag, Os and alloys comprising any of these noble metals as the main ingredient. Especially preferred for use herein is Pt having excellent corrosion resistance.

In case where the inner surface of the autoclave is lined or coated with a noble metal, but when the entire inner surface of the autoclave is difficult to line or coat therewith, then a part of the upper region and/or a part of the lower region of the autoclave may be kept unlined or uncoated.

If desired, a baffle plate may be installed inside the autoclave to thereby partition the autoclave into the starting material charging part 3B to be charged with a starting material of GaN polycrystalline nitride or the like, and a crystal growing part 3A in which a seed crystal such as GaN or the like is disposed. As the autoclave in the invention, usable is an autoclave composed of a noble metal-made vessel housed in a heat-resistant vessel, as in JP-A 2005-289797.

The starting material to be used in the invention for production of nitride crystals is generally a powdery polycrystalline material (hereinafter referred to as "polycrystalline material") of nitride, and is preferably a gallium nitride-containing material. The polycrystalline material may not be a complete nitride, and depending on the condition, it may contain a metal-state (or that is, zero-valent) metallic component. Though not clear, it may be presumed that the reason why the starting material may contain a metal-state metallic component may be because, when the reaction system is contaminated with a minor amount of oxygen coming therein, the metal-state metallic component may serve as an oxygen-trapping agent of preventing oxygen from diffusing in a nitrogen-containing solvent. The content of the metal-state metallic component is not specifically defined; however, if too much, the generation of hydrogen from ammonia in oxidation of the metallic component during the growth of nitride crystals could not be ignorable, and taking it into consideration, the content is preferably determined.

The method for producing the polycrystalline material to be the starting material in the invention is not specifically defined. For example, usable are nitride polycrystals formed through reaction of a metal or its oxide or hydroxide with ammonia in a vessel where ammonia gas is circulated. As a metal compound material having higher reactivity, also usable are halides, amide compounds, imide compounds, compounds having a covalent bond M-N such as galazan, etc. Further usable are nitride polycrystals produced through reaction of a metal such as Ga with nitrogen at high temperature and under high pressure (e.g., GaN).

The polycrystalline material must be protected as much as possible from being contaminated with water and oxygen in order that high-quality crystals can be produced through crystal growth thereof. Accordingly, the oxygen content in the polycrystalline material is generally at most 5% by mass, preferably at most 2% by mass, more preferably at most 0.5% by mass. The easiness of contamination of the polycrystalline material with oxygen is correlated with the reactivity thereof with water or with the water absorbability thereof. A polycrystalline material of poorer crystallinity may have a larger quantity of an active group such as NH group, and there is a possibility that the group may react with water to a partial oxide or hydroxide. Accordingly, it is desirable that a polycrystalline material of which the crystallinity is as high as possible is used, and the crystallinity can be estimated by the half-value width of the powdery X-ray diffraction pattern of the material. A preferred polycrystalline material has a half-value width of the (100) diffraction line ($2\theta$=about 32.5° in hexagonal gallium nitride) generally at 0.25° or less, preferably at 0.20° or less, more preferably at 0.17° or less.

Regarding the particle size of the primary particles of the polycrystalline material, preferably, the mean particle size thereof is within a range of from 1 to 100 μm. The particles having a smaller particle size have a larger specific surface area, and are therefore preferred as the dissolution rate thereof in a solvent is larger. However, when too small, the particles may be transported to the crystal growing zone of the reactor by thermal convection, and in case where a seed crystal is used, the particles may adhere to the seed crystal.

Two types of polycrystalline materials each having a different mean particle size may be used as combined. Small particles of a polycrystalline material having a higher dissolution rate and large particles of a polycrystalline material having a smaller dissolution rate may exist together in the autoclave, and they may prevent a trouble of failure in feeding Ga (or Ga-containing) ion and the like to the crystal growing part, and consequently, especially in a case where a seed crystal is used, the disadvantage of dissolution of the seed crystal in growth of bulk single crystals may be prevented.

The morphology of the polycrystalline material is not specifically defined. In consideration of the uniformity in dissolution in solvent, in general, the secondary particles of the material are preferably spherical. For increasing the charging amount, and for preventing the movement of the particles by thermal convection, the polycrystalline material may be shaped into pellets or blocks.

The polycrystalline material is, in general, mixed with an additive called a mineralizing agent and then fed to the crystallization step based on solution growth. The mineralizing agent is an additive for increasing the solubility of the polycrystalline material in a solvent. One mineralizing agent alone may be used, but if desired, a mineralizing agent may be combined with a co-mineralizing agent, or two or more mineralizing agents may be used as combined. The ratio of the polycrystalline material to the mineralizing agent may be, for example, in a case of GaN, generally within a range of from 0.001 to 10 as a molar ratio of mineralizing agent/Ga, and the ratio may be suitably determined in consideration of the type of the starting material and the additive such as the mineralizing agent, as well as the size of the intended crystal.

The mineralizing agent is generally a compound containing a halogen atom or an alkali metal, an alkaline earth metal or a rare earth metal. Preferably, the mineralizing agent contains a nitrogen atom in the form of an ammonium ion or an amide. Examples of the halogen atom-containing mineralizing agent include ammonium halides, hydrogen halides, ammonium hexahalosilicates, hydrocarbylammonium fluorides; alkylammonium salts such as tetramethylammonium halide, tetraethylammonium halide, benzyltrimethylammonium halide, dipropylammonium halide, isopropylammonium halide; metal alkyl halides such as sodium alkyl fluoride, etc.

The mineralizing agent containing an alkali metal, an alkaline earth metal or a rare earth metal includes alkali metals, alkaline earth metals, alkali halides, alkaline earth halides, rare earth halides, etc. Oxyacid salts such as alkali metal, alkaline earth metal or rare earth metal carbonates are also usable; however, from the viewpoint that the formed crystals do not contain oxygen, the mineralizing agent preferably contains a nitrogen atom as an ammonium ion or amide. For protecting the nitride crystals from being contaminated with impurities, if desired, the mineralizing agent may be purified and dried before use. The purity of the mineralizing agent is generally at least 95%, preferably at least 98%, more preferably at least 99%, even more preferably at least 99.5%. Preferably, water and oxygen to be in the mineralizing agent are as small as possible, and are more preferably at most 1000 ppm, even more preferably at most 100 ppm.

Specific examples of the mineralizing agent containing an alkali metal or the like and a nitrogen atom include alkali metal amides such as sodium amide ($NaNH_2$), potassium amide ($KNH_2$), lithium amide ($LiNH_2$), lithium diethylamide (($C_2H_5$)$_2$NLi), etc.; alkaline earth metal amides such as $Mg(NH_2)_2$, etc.; rare earth amides such as $La(NH_2)_3$, etc.; alkali metal nitrides or alkaline earth metal nitrides such as $Li_3N$, $Mg_3N_2$, $Ca_3N_2$, $Na_3N$, etc.; azide compounds such as $NaN_3$, etc.; zinc nitride ($Zn_3N_2$), etc. Also mentioned are hydrazine salts such as $NH_2NH_3Cl$; and ammonium carbonate (($NH_4$)$_2CO_3$) and ammonium carbamate ($NH_2COONH_4$).

Of those, preferred are halogen atom-containing additives (mineralizing agents) that are alkali halides, alkaline earth halides, ammonium halides, hydrogen halides; more preferred are alkali halides, ammonium halides; and even more preferred are ammonium halides. These additives have a high solubility in an ammonia solvent in a supercritical condition, and have a nitridation capacity in ammonia, and have a small reactivity with a noble metal such as Pt, etc. One or more such additives may be used here either singly or as combined. When used, the additive promotes the dissolution of the starting material and suitably controls the reaction condition, therefore giving high-quality bulk nitride crystals having a large size within a short period of time.

In the invention, the polycrystalline material and the additive such as the mineralizing agent mixed as in the above is charged into the autoclave 3; and if not specifically desired, the polycrystalline material and one or more additives such as mineralizing agents may be separately charged into the autoclave 3. Depending on the type of the starting material and the additives such as the mineralizing agent, they may be charged into the autoclave 3 as vapor or liquid or as dissolved in solvent, through the ammonia feed port 4 or the like, after the autoclave 3 is closed.

In case where the polycrystalline material and the additives such as the mineralizing agent are hygroscopic, preferably, the polycrystalline material and the mineralizing agent are fully dried by degassing under heat before charging. Further, in case where a highly degradable mineralizing agent and a polycrystalline material are mixed and charged, preferably, the charging is attained rapidly in an atmosphere from which oxygen and moisture are removed as much as possible. For example, in a vessel or chamber filled with an inert gas, the inside of the vessel is fully purged with an inert gas, and then the highly degradable mineralizing agent and the polycrystalline material may be charged into the vessel.

After the polycrystalline material and the additives such as the mineralizing agent are, as mixed, charged into the autoclave 3, or are separately charged into the autoclaves 3, the autoclave 3 is closed. Next, the autoclaved is degassed by heating. This embodiment is also preferred. Preferably, a substance serving as a scavenger of selectively absorbing oxygen and moisture (for example, metal pieces of titanium or the like) is mixed in the autoclave 3.

The starting material and the additives such as the mineralizing agent are, in general, so charged into the autoclave 3 that they are housed in the starting material charging part 3B in the lower region of the autoclave 3. There is given a temperature difference between the lower region of the autoclave 3 and the upper region of the autoclave 3, whereby the dissolved starting material is precipitated out as crystals in the crystal growing part of the upper region of the autoclave 3. To that effect, crystals are formed through the process of dissolution and precipitation of the starting material, and high-purity and high-quality bulk crystals of high crystallinity can be thus formed.

In the invention, a seed crystal is put in the crystal growing part 3A of the upper region of the autoclave 3, and the formation of single crystals is promoted and larger single crystals can be thus formed. The seed crystal may be set in the part, in general, simultaneously with or after the charging of the starting material and the additives such as the mineralizing agent therein; and in general, the seed crystal is fixed to a tool formed of a noble metal similar to the noble metal constituting the inner surface of the autoclave 3. If desired, after the autoclave 3 is thus charged, it may be degassed by heating effectively.

The seed crystal is preferably a single crystal of the intended nitride, but it may not be always the same nitride, and, as the case may be, an oxide single crystal may be used. However, in that case, the seed crystal must have the same or compatible lattice constant and crystal lattice size parameter as those of the intended nitride, or must be a seed crystal formed of a monocrystalline material piece or a polycrystalline material piece as coordinated to secure the heteroepitaxy (that is, some conformance of the crystallographic configuration of atoms). Specific examples of the seed crystal include, for example, for gallium nitride (GaN), a single crystal of GaN and, in addition to this, a nitride single crystal of AlN or the like, a single crystal of zinc oxide (ZnO), a single crystal of silicon carbide (SiC), lithium gallate ($LiGaO_2$), zirconium diboride ($ZrB_2$), etc.

The seed crystal may be determined in consideration of the solubility thereof in an ammonia solvent and of the reactivity thereof with the mineralizing agent. For example, for the seed crystal of GaN, employable are a single crystal formed by epitaxial growth on a heterogeneous substrate such as sapphire or the like according to an MOCVD method or an HVPE method followed by peeling it; a single crystal formed through crystal growth from a metal Ga with a flux of Na, Li or Bi; a single crystal formed through homo/heteroepitaxial growth according to an LPE method; a single crystal formed according to the solution growth method including the method of the invention; and crystals cut out of those crystals.

The purity of ammonia to be charged according to the liquefied ammonia charging method of the invention may be generally at least 99.9%, preferably at least 99.99%, more preferably at least 99.999%, even more preferably at least 99.9999%. Ammonia generally has a high affinity for water, and therefore, when the autoclave 3 is charged with an ammonia solvent, then water-derived oxygen may be readily introduced into the autoclave 3, and owing to it, the oxygen amount to be in the crystal may increase and the nitride crystallinity may be thereby worsened. From this viewpoint, the amount of water and oxygen to be in the ammonia solvent is as small as possible, and preferably, it is at most 1000 ppm, more preferably at most 100 ppm, even more preferably at most 10 ppm.

(4) Embodiment of Production Method for Nitride Crystals:

The process of the production method for nitride crystals of the invention is described below.

In the invention, after the starting material and the additives such as the mineralizing agent (and, if desired, seed crystal) are charged into the autoclave 3, ammonia is charged thereinto according to the ammonia charging method of the invention (ammonia charging step).

After the ammonia solvent is charged into the autoclave 3, the valves V2 and V3 are closed and the autoclave is thereby closed, and then the pipeline of the ammonia charging apparatus is removed. The autoclave 3 is closed, and this is important for the purpose protecting the contents from being contaminated from water or oxygen in air. In particular, in case where the autoclave 3 is kept open after the ammonia solvent has been charged into the autoclave 3, then the ammonia may go out and the charging rate may lower, and there occur some problems in that the autoclave 3 is cooled by the large latent heat of the ammonia solvent and air in water may be readily condensed and the autoclave is not safe.

According to the above-mentioned operation, the starting material, the additives such as the mineralizing agent, and ammonia are charged into the autoclave 3, and then the autoclave 3 is heated with the electric furnace 9 having a thermocouple 10 or the like as in FIG. 9 (crystallization step).

In this, the ammonia solvent in the autoclave 3 is preferably in a subcritical state or supercritical state during the synthesis or growth of nitride crystals. A supercritical fluid means a concentrated vapor kept at the critical temperature thereof or higher; and the crystal temperature means a temperature at which the vapor could not be liquefied under pressure. In general, the supercritical fluid has a low viscosity and is more readily diffused than a liquid, but has the same solvation power as that of a liquid. The physical properties of the ammonia solvent differ from those of water used as a solvent in hydrothermal synthesis (growth), and could not be said to have been clarified, and therefore, the reason why the dissolution of the starting material and others and the formation and dissolution/precipitation of nitride crystals can be promoted under the subcritical condition or the supercritical condition; however, when the concept of the ionic product known for water is applied to the nitrogen-containing solvent, then it may be considered that, with the temperature elevation, the ionic product increases and the effect of ammonolysis that corresponds to hydrolysis with water may thereby increase, and this may contribute toward the crystal growth.

In case where the solvent is used in the supercritical state thereof, in general, the reaction mixture is kept at a temperature higher than the critical point of the solvent. Regarding the critical point of the ammonia solvent, the critical temperature thereof is 132° C., and the critical pressure thereof is 11.35 MPa. The reaction mixture is sealed up on a vessel having a constant capacity, and therefore, the temperature elevation increases the pressure of the fluid. In general, when T>Tc (critical temperature of one solvent) and P>Pc (critical pressure of one solvent), then the fluid is in a supercritical state.

In fact, the solubility of the nitride polycrystalline material in the solvent greatly differs between the subcritical state and the supercritical state, and therefore under the supercritical condition, nitride crystals grow at a sufficient growing speed. The reaction time especially depends on the reactivity and the thermomechanical parameters of the mineralizing agent and the co-mineralizing agent, or that is, the data of temperature and pressure thereof. During the synthesis or growth of nitride crystals, the pressure vessel 3 is kept having an inner pressure of from 5 MPa to 2 GPa or so, and the autoclave 3 is also kept having the same inner pressure as that of the pressure vessel 3. The pressure may be suitably determined depending on the temperature and on the charging rate of the solvent volume to the volume of the autoclave 3. Naturally, the inner pressure of the autoclave 3 is indiscriminately determined by the temperature and the charging rate, but in fact, it may differ in some degree depending on the starting material and the additives such as the mineralizing agent, and on the temperature unevenness inside the autoclave 3 and the presence of a dead space inside it.

The dissociation equilibrium of the ammonia solvent greatly inclines to nitrogen and hydrogen at a high temperature, and therefore, at a high temperature, the pressure change owing to it may not be ignorable. In general, the dissociation reaction is catalyzed by the metallic component, and there may be a possibility that the dissociation could reach the equilibrium depending on the type of the starting material and the additives such as the mineralizing agent. In the invention, the temperature range inside the autoclave 3 is preferably such that the lowermost limit is generally at least 150° C., preferably at least 200° C., more preferably at least 300° C., and the uppermost limit is generally at most 800° C., preferably at most 700° C., more preferably at most 650° C. The pressure range inside the autoclave 3 (that is, the pressure range inside the autoclave 3) is preferably such that the lowermost limit is generally at least 20 MPa, preferably at least 30 MPa, more preferably at least 50 MPa, and the uppermost limit is generally at most 500 MPa, preferably at most 400 MPa, more preferably at most 200 MPa.

The proportion of the ammonia solvent injection into the autoclave 3, or that is, the charging rate to attain the above-mentioned temperature range and pressure range of the autoclave 3 may be generally from 20 to 95%, preferably from 30 to 90%, more preferably from 40 to 85%, based on the liquid density of ammonia in the standard state thereof (in case where ammonia is gaseous in the standard state, the liquid density at the boiling point) in the free capacity of the autoclave 3, or that is, in case where the polycrystalline material and the seed crystal are put into the autoclave 3, the capacity to be computed by subtracting the volume of the seed crystal and the structure for it from the capacity of the autoclave 3, or in case where a baffle plate known to those skilled in the art of production of bulk single crystal products through hydrothermal growth is installed, the capacity computed by further subtracting the volume of the baffle plate from the capacity of the autoclave 3.

The solution growth reaction of nitride crystals in the autoclave 3 described in the above may be attained by heating the autoclave 3 with the electric furnace 9 having the thermocouple 10 or the like, whereby the ammonia in the autoclave 3 is kept in a subcritical state or in a supercritical state. The heating method and the heating rate to the predetermined reaction temperature are not specifically defined; but in general, the heating takes from a few hours to a few days. If desired, multistage heating may be employed, or the heating speed may be changed within the temperature range.

The temperature profile toward the inside of the autoclave 3 may vary depending on the heating condition and the heat retention condition such as typically the shape of the autoclave 3, the shape of the electric furnace 9 in which the autoclave is set, and the positional relationship between the two. The reaction temperature may be presumed from the temperature inside the autoclave 3 by estimating or extrapolating the temperature profile toward the inside of the autoclave 3 for the thermostat 10. Similarly, the temperature in the vertical direction of the autoclave 3 may vary depending on the heating condition and the heat retention condition such as typically the shape of the autoclave 3, the shape of the electric furnace 9 in which the autoclave is set, and the positional relationship between the two. Accordingly, it is desirable that the temperature of the autoclave 3 is measured in some points in the vertical direction on the upper surface thereof and the temperature inside the autoclave 3 at each point is estimated for temperature control of the autoclave.

The reaction time after the temperature has reached a predetermined level may vary depending on the type of the nitride crystals, the type of the starting material and the mineralizing agent to be used, and the size and the amount of the crystals to be produced, but in general, it may be from a few hours to hundreds of days. During the reaction, the reaction temperature may be kept constant, or may be gradually elevated or lowered. After the reaction time for forming the desired crystals, the system is cooled. The cooling method is not specifically defined. The heater may be stopped and the autoclave 3 may be left as such in the furnace so as to be cooled therein; or the autoclave 3 may be removed from the electric furnace 9 and cooled with air. If desired, a coolant may be used for rapid cooling, and this is also a preferred embodiment. During cooling, the crystals may be segregated, and depending on the additives such as a specific mineralizing agent, the autoclave 3 may be cooled with some partial temperature difference given thereto or may be cooled while partially slightly heated for preventing the segregation.

After the temperature of the outer face of the autoclave 3 or the temperature of the inside of the autoclave 3 has reached a predetermined level or lower, the autoclave 3 is opened. In this stage, the predetermined temperature level is not specifically defined, and may be generally from −80° C. to 200° C., preferably from −33° C. to 100° C.

In case where the inner temperature of the autoclave 3 is fully high, the ammonia solvent moves as a vapor and is absorbed by water, etc. In this, for shortening the moving time, preferably, the autoclave may be again heated. Also preferably, the vessel to which the ammonia vapor is moved may be cooled not filled with water or the like. In the case where the method of making the vapor absorbed by water or the like solvent is not employed, the recovered ammonia solvent can be reused with ease.

Further if desired, after the ammonia solvent inside the autoclave 3 is fully removed by vacuuming, the autoclave 3 is dried and then opened by removing its cap, and the formed nitride crystals and the unreacted starting material and additives such as mineralizing agent may be taken out.

In the above, the production method of the invention is described with reference to the example of using a polycrystalline nitride as the starting material; however, in principle, such a polycrystalline nitride may not be used as the starting material, but a compound similar to it or a compound according to it or a precursor capable of being converted into such compounds may be used as the starting material in carrying out the above-mentioned method. The compounds and their precursors include compounds having a covalent bond M-N such as galazan and the like previously listed in the above as the starting material, as well as metal amides such as Ga (NH$_2$)$_3$, etc.; alkali metal amides such as KGa (NH$_2$)$_4$, etc.; metal imides; halides such as, GaCl$_3$, etc.; halide ammonia adducts; and halometal salts such as ammonium halogallate, etc. Also usable are hydroxides, oxides and oxyacid salts, though not positively used in the sense of preventing the crystals from being contaminated with oxygen impurities.

In case where the bulk nitride crystals are produced using a starting material of not the above-mentioned polycrystalline nitride, the nitride production and the dissolution and precipitation of the nitride in a nitrogen-containing solvent must be attained simultaneously, which therefore requires stricter reaction condition control. In case where the control is extremely difficult or in case where larger bulk crystals are desired, preferably employed is a multistage production method. Specifically, a compound similar to or according to the above-mentioned polycrystalline starting material, or a precursor capable of being converted into it is used as the starting material, and a polycrystalline compound is first produced under a reaction condition, and then using the resulting polycrystalline nitride as the starting material, the intended bulk nitride crystals are grown similarly according to the production method of the invention. In case where the starting material of the above type is used, it is easy to produce the intended bulk nitride crystals according to the multistage production method. In this, the multistage reaction may be attained continuously in one and the same vessel with no removal of ammonia therefrom, or the same or different ammonia or mineralizing agent may be separately used in the different stages. The produced polycrystalline nitride material is once taken out and washed, and then it may be put into the same vessel or a different vessel and may be grown therein into nitride crystals. In this, preferably, a seed crystal may be put in the vessel, as in the above.

The contamination of the nitride crystals produced according to the production method of the invention with transition metal impurities may be reduced generally to at most 0.1% by mass. The bulk nitride crystals obtained according to the invention may be, if desired, washed with hydrochloric acid (HCl), nitric acid ($HNO_3$) or the like. The vessel from which the produced crystals and the unreacted starting material and additives such as mineralizing agent have been removed may be washed similarly, if desired.

The washed nitride crystals may be sliced vertically to a specific crystal face, depending on the orientation thereof, and further if desired, they may be etched or polished to give commercial products of self-sustained nitride single crystal substrates. Thus obtained, the nitride single crystal substrates have few impurities and have high crystallinity, have few lattice defects and a reduced dislocation density, and have no impurity level formation; and therefore, in producing various devices such as VPE, MOCVD, etc., they are especially excellent as substrates for homoepitaxial growth thereon. In particular, regarding gallium nitride, no industrial production thereof is known for high-quality single crystal substrates for homoepitaxial growth. A self-sustained gallium crystal single crystal substrate may be produced through epitaxial growth of gallium nitride on sapphire via a buffer layer according to a method of VPE or the like, followed by removal of the sapphire and the buffer layer; however, this is so-called heteroepitaxial growth on the substrate differing from gallium nitride in the lattice constant and the thermal expansion coefficient, and therefore the formed gallium nitride often has lattice defects. Regarding this, the gallium nitride crystals produced according to the invention are excellent from the viewpoint of the lattice defects and the dislocation density.

Further, the nitride crystals produced according to the invention, and those produced by cutting, slicing, etching or polishing them are excellent as seed crystals for use in various solution growth methods including a solution growth method using an ammonia solvent, as they contain few impurities and they have a high crystallinity.

EXAMPLES

The characteristics of the invention are described more concretely with reference to the following Examples and Comparative Examples, in which the material used, its amount and the ratio, the details of the treatment, the treatment process and the apparatus for the treatment may be suitably modified or changed not overstepping the spirit and the scope of the invention. Accordingly, the scope of the invention should not be limitatively interpreted by the Examples mentioned below.

Charging Example 1

The liquefied ammonia charging apparatus of FIG. 1 was used in Charging Example 1. The valves V1, V4 and V5 are electromagnetic valves (on-off valves), and were automatically controlled by the control unit 8 shown in FIG. 2. The vales V2 and V3 are needle valves, and controlled manually. The autoclave 3 has an inner diameter of 100 mm and has an inner capacity capable of being charged with 5.61 kg of liquefied ammonia. The autoclave is lined with platinum, but a material was not put therein.

First, the valve V1 and the mass flow controller MFC1 were closed, and the valves V2 to V5 and the mass flow controller MFC2 were opened, and the entire system was vacuumed by suction from the discharge side of MFC2 with a vacuum pump. The ammonia feeding amount was 3.500 kg as a total of the ammonia amount to be a charging rate of 50% (2.805 kg) and the ammonia amount for charging rate control (0.695 kg). The mass flow controller MFC1 was so programmed that the feeding amount could be 3.500 kg and the feeding flow rate could be 50 NL/min. The valve V2 and the valve V4 were closed and the valve V1 and the mass flow controller MFC1 were opened, whereby the gaseous ammonia discharged out from the ammonia cylinder 1 was fed to the condenser 2 along the flow shown by A in FIG. 3. At the same time, the gaseous ammonia was led into the autoclave 3 via the valve V5 and the valve V3 along the flow shown by A' in FIG. 3. In this stage, the gaseous ammonia amount actually fed via the mass flow controller MFC1 was 3.4998 kg. The gaseous ammonia fed to the condenser 2 was condensed in the condenser 2 to be liquefied ammonia, which was accumulated between the valve V2 and the condenser 2 (B in FIG. 3).

Next, the valve V1 and the valve V4 were kept closed and the valves V3 and V5 were kept open, and the valve V2 was gradually opened whereby the liquefied ammonia was fed into the autoclave 3 via the ammonia feed port 4. In this stage, the pressure in the system was controlled to be at most 0.2 MPa. The liquefied ammonia fed to the autoclave 3 immediately vaporized, and the autoclave 3 was gradually cooled by the latent heat thereof. The gaseous ammonia formed through vaporization of the liquefied ammonia in the autoclave 3 was discharged out through the ammonia discharge port 5, and was fed to the condenser 2 via the valve V5 along the flow shown by C in FIG. 4. The gaseous ammonia fed to the condenser 2 was again liquefied and accumulated. The accumulated liquefied ammonia was again fed to the autoclave 3 for ammonia circulation.

Waiting for the moment at which the liquefied ammonia corresponding to an amount larger a little than 50% of the inner capacity of the autoclave 3 (2.805 kg) was charged in the autoclave, the valves V2 and V3 were closed. For measuring the ammonia amount remaining in the condenser 2 and the pipeline in a pre-step of charging rate control, the valves V1, V2 and V3 and the mass flow controller MFC1 were closed and the valves V4 and V5 and the mass flow controller MFC2 were opened, and the ammonia remaining therein was discharged out into the ammonia removing tower 7 along the flow D in FIG. 5 and absorbed by water therein. In this stage, the gaseous ammonia amount discharged out of the system was metered with the mass flow controller MFC, and was 0.5111 kg. The amount corresponding to the charging rate 50% (2.805 kg) and the amount remaining in the condenser and the pipeline (0.5111 kg) was subtracted from the actual feeding amount (3.4998 kg) fed to the system via the mass flow controller MFC1, thereby computing the ammonia amount necessary for charging rate control (0.1837 kg), and this was programmed in the mass flow controller MFC2. Next, the valves V1, V2 and V5 and the mass flow controller MFC1 were closed and the valves V3 and V4 and the mass flow controller MFC2 were opened, and the programmed ammonia amount was discharged out into the ammonia removing tower 7. Finally, the valves V1, V2 and V3 were closed and the valves V4 and V5 and the mass flow controller MFC2 were opened, and the gaseous ammonia in the pipeline was removed along the flow of E in FIG. 6 through suction from the discharge side of the mass flow controller MFC2. Up to this, the gaseous ammonia flow amount having passed through the mass flow controller MFC2 was 0.6952 kg.

The liquefied ammonic charged in the autoclave 3 is computed as (the gaseous ammonia amount having passed through the mass flow controller MFC1)–(the gaseous ammonia amount having passed through the mass flow controller MFC2). The charging amount computed from the flow data metered by the mass flow controller MFC1 and the mass flow controller MFC2 was 2.8046 kg, and the charging rate was 49.99%, or that is, the charging rate error was 0.01%. The data metered by the mass flow controllers include an error of ±1% each; and therefore, the liquefied ammonia amount charged in the autoclave 3 is strictly computed to be 2.8046 kg±0.042 kg, according to the following formula:

(3.4998±0.035)−(0.6952±0.007)=2.8046±0.042

Charging Example 2

Liquefied ammonia was charged in the autoclave 3 at a targeted charging rate of 29% according to the same method as in Charging Example 1, except that the gaseous ammonia feeding amount to be fed from the ammonia cylinder 1 into the system and the liquefied ammonia charging rate in the autoclave 3 were changed as in Table 1. The error was as shown in Table 1.

Charging Example 3

Using the same liquefied ammonia charging apparatus as in Charging Example 1, the autoclave 3 was charged with liquefied ammonia at a targeted charging rate of 50% according to a so-called flow method.

First, for removing air from the system, the valve V1 and the mass flow controller MFC1 were closed and the valves V2 to V5 and the mass flow controller MFC2 were opened, and the entire system was vacuumed by suction from the discharge side of MFC2 with a vacuum pump. The ammonia feeding amount was 3.500 kg as a total of the ammonia amount to be a charging rate of 50% (2.805 kg) and the ammonia amount for charging rate control (0.695 kg). The mass flow controller MFC1 was so programmed that the feeding amount could be 3.500 kg and the feeding flow rate could be 50 NL/min. The valve V2 and the valve V4 were closed and the valve V1 and the mass flow controller MFC1 were opened, whereby the gaseous ammonia discharged out from the ammonia cylinder 1 was fed to the condenser 2 along the flow shown by A in FIG. 3. At the same time, the gaseous ammonia was led into the autoclave 3 via the valve V5 and the valve V3 along the flow shown by A' in FIG. 3. The gaseous ammonia fed to the condenser 2 was condensed in the condenser 2 to be liquefied ammonia, which was accumulated between the valve V2 and the condenser 2 (B in FIG. 3).

Next, MFC1 and MFC2 were programmed at a flow rate of 50 NL/min, and ammonia charging was started. The valves V1, V2, V3 and V4 and MFC1 and MFC2 were opened and the valve V5 was closed, and ammonia was made to run through the system along the flow shown in FIG. 8. First, the gaseous ammonia discharged out from the ammonia cylinder 1 is fed into the condenser 2. The gaseous ammonia fed to the condenser 2 was condensed in the condenser 2 to be liquefied ammonia, and accumulated between the valve V2 and the condenser 2 (B in FIG. 3). The accumulated liquefied ammonia was fed into the autoclave 3 through the ammonia feed port 4 via the valve V2 kept open. In this stage, the pressure in the system was controlled to be at most 0.2 MPa. The liquefied ammonia fed to the autoclave 3 immediately vaporized, and the autoclave 3 was gradually cooled by the latent heat thereof. The gaseous ammonia formed through vaporization of the liquefied ammonia in the autoclave 3 was discharged out through the ammonia discharge port 5, and was led to the ammonia removing tower 7 and absorbed by water therein.

Waiting for the moment at which the liquefied ammonia corresponding to an amount larger a little than 50% of the inner capacity of the autoclave 3 (2.805 kg) was charged in the autoclave 3, the valves V2 and V3 were closed. In this stage, the data metered by the mass flow controller MFC1 and the mass flow controller MFC2 were 13.220 kg and 9.7199 kg, respectively. In this stage, 3.5000 kg of ammonia remained in the system. For measuring the ammonia amount remaining in the condenser and the pipeline in a pre-step of charging rate control, the valves V1, V2 and V3 and the mass flow controller MFC1 were closed and the valves V4 and V5 and the mass flow controller MFC2 were opened, and the ammonia remaining therein was discharged out into the ammonia removing tower along the flow D in FIG. 5 and absorbed by water therein. In this stage, the ammonia amount discharged out of the system was metered with the mass flow controller MFC2 (0.3499 kg). The amount corresponding to the charging rate 50% (2.805 kg) and the amount remaining in the condenser and the pipeline (0.3499 kg) was subtracted from the remaining amount in the system (3.5000 kg), thereby computing the ammonia amount necessary for charging rate control (0.3450 kg), and this was programmed in the mass flow controller MFC2. Next, the valves V1, V2 and V5 and the mass flow controller MFC1 were closed and the valves V3 and V4 and the mass flow controller MFC2 were opened, and the programmed ammonia amount was discharged out into the ammonia removing tower 7. Finally, the valves V1, V2 and V3 were closed and the valves V4 and V5 and the mass flow controller MFC2 were opened, and the gaseous ammonia in the pipeline was removed through suction from the discharge side of the mass flow controller MFC2. In this stage, the gaseous ammonia flow amount having passed through the mass flow controller MFC2 was 0.3499 kg.

According to the same method as in Charging Example 1, the charging rate and the error were computed, and the results are shown in Table 1.

Charging Examples 4 to 6

Using the same apparatus as in Charging Examples 1 to 3 and according to the same method as in Charging Examples 1 to 3, the process up to the step of closing the valve V2 and valve V3 was carried out, waiting for the moment at which the liquefied ammonia corresponding to an amount larger a little than the targeted charging rate of the inner capacity of the autoclave 3 was charged in the autoclave, and at this stage, the charging of the vessel with the liquefied ammonia was finished.

According to the same method as in Charging Example 1, the charging rate and the error were computed, and the results are shown in Table 1.

TABLE 1

| | Targeted Charging Rate (%) | Chargeable Amount in Vessel (kg) | Targeted Charging Amount in Vessel (kg) | Gaseous Ammonia Feeding Amount (kg) | Gaseous Ammonia Discharging Amount (before charging amount control) (kg) | Ammonia Amount remaining in condenser and pipeline (kg) | Targeted Charging Control Amount (kg) |
|---|---|---|---|---|---|---|---|
| Charging Example 1 (the invention) | 50 | 5.61 | 2.8050 | 3.4998 | 0.0000 | 0.5111 | 0.1837 |
| Charging Example 2 (the invention) | 20 | 5.61 | 1.1220 | 3.4055 | 0.0000 | 2.0932 | 0.1904 |
| Charging Example 3 (the invention) | 50 | 5.61 | 2.8050 | 13.2200 | 9.7199 | 0.3500 | 0.3450 |
| Charging Example 4 (the invention) | 50 | 5.61 | 2.8050 | 3.4998 | 0.0000 | 0.5111 | 0.1837 |
| Charging Example 5 (the invention) | 20 | 5.61 | 1.1220 | 3.4055 | 0.0000 | 2.0932 | 0.1904 |
| Charging Example 6 (comparison) | 50 | 5.61 | 2.8050 | 13.2200 | 9.7199 | 0.3500 | 0.3450 |

| | Actual Charging Control Amount (kg) | Gaseous Ammonia Total Discharging Amount (after charging amount control) (kg) | Actual Charging Amount in Vessel (kg) | Actual Charging Rate (%) | Charging Error (targeted amount − actual amount) (%) |
|---|---|---|---|---|---|
| Charging Example 1 (the invention) | 0.1841 | 0.6952 | 2.8046 | 49.99 | 0.01 |
| Charging Example 2 (the invention) | 0.1902 | 2.2834 | 1.1222 | 20.00 | 0.00 |
| Charging Example 3 (the invention) | 0.3499 | 0.6999 | 2.8001 | 49.91 | 0.09 |
| Charging Example 4 (the invention) | no control | 0.5111 | 2.9887 | 53.27 | −3.27 |
| Charging Example 5 (the invention) | no control | 2.0932 | 1.3124 | 23.39 | −3.39 |
| Charging Example 6 (comparison) | no control | 0.3500 | 3.1500 | 56.15 | −6.15 |

(Example of Growth of Gallium Nitride Single Crystal)

As a mineralizing agent, fully dried powdery NH$_4$Cl (purity 99.999%) was charged in the starting material charging part 3B in the autoclave 3 shown in FIG. 9, and a seed crystal of gallium nitride was put on the baffle plate in the crystal growing part 3A, and the cap was closed. Next, the liquefied ammonia charging apparatus as in FIG. 1 was constructed, and according to the same method as in the above-mentioned Charging Examples, the autoclave 3 was charged with liquefied ammonia.

Subsequently, the autoclave 3 was jacketed with the electric furnace 9 composed of two upper and lower divisions. The autoclave was heated so as to have a temperature difference between the lower outer surface at 490° C. and the upper outer surface at 450° C., taking 24 hours, and when the lower outer surface of the autoclave reached 490° C. and the upper outer surface thereof reached 450° C., the autoclave was further kept under the temperature condition for 240 hours. Next, the heating with the heater was stopped, and the autoclave 3 was spontaneously cooled, as left in the electric furnace 9, until the lower outer surface thereof could be at room temperature, taking about 3 days. Next, the valve communicating with the ammonia discharge port 5 attached to the autoclave was first opened, and NH$_3$ in the autoclave 3 was removed. Next, the valve communicating with the ammonia discharge port 5 was once closed, then the autoclave was connected to a vacuum pump, the valve was again opened, and NH$_3$ in the autoclave 3 was almost completely removed. Accordingly, the growth of gallium nitride single crystals in the autoclave 3 was confirmed.

In case where the vessel is charged with liquefied ammonia according to the method of the invention, the ultimate pressure can be estimated with accuracy by temperature control, and therefore, gallium nitride single crystals can be grown efficiently under a suitable running condition. As opposed to this, in case where the vessel is charged according to a method except the invention, the accuracy in estimating the ultimate pressure is low, and therefore it is difficult to optimize the running condition, and it is not easy to efficiently grow a gallium nitride single crystal.

INDUSTRIAL APPLICABILITY

The charging method of the invention does not require a cooling apparatus, and according to the method, a vessel can be charged with liquefied ammonia with few impurities inexpensively with high accuracy. When nitride crystals are grown using the vessel charged with liquefied ammonia according to the invention, then the ultimate pressure can be estimated with accuracy by temperature control, and therefore the crystals can be grown efficiently under a suitable condition. Accordingly, the industrial applicability of the invention is great.

The invention claimed is:

1. A method for charging with liquefied ammonia comprising sequentially:
   feeding gaseous ammonia in a condenser,
   converting the gaseous ammonia into a liquefied ammonia in the condenser, and
   feeding the liquefied ammonia formed in the condenser to a vessel to thereby charge the vessel with the liquefied ammonia;
   wherein the following process group (A) is carried out between the conversion to the liquefied ammonia and the charge with the liquefied ammonia, or the following process group (B) is carried out after the charge with the liquefied ammonia, or both the two process groups are carried out:
   [Process group (A)]
   feeding the liquefied ammonia formed in the condenser to the vessel and cooling the vessel by the latent heat of vaporization of the liquefied ammonia, and
   feeding the gaseous ammonia formed through vaporization of the liquefied ammonia to the condenser;
   [Process group (B)]
   metering the total ammonia amount M1 existing inside the ammonia-charging apparatus and the ammonia amount M2 existing inside the ammonia-charging apparatus except the vessel, under the condition of stopping the running of the liquefied ammonia in and out of the vessel, and
   discharging the liquefied ammonia out of the vessel in an amount corresponding to the difference, M1−M2−MC, wherein MC is a programmed liquefied ammonia-charging amount in the vessel.

2. The liquefied ammonia charging method according to claim 1, wherein the vessel has a feed port for feeding the liquefied ammonia thereinto and a discharge port for discharging the gaseous ammonia out of the vessel.

3. The liquefied ammonia charging method according to claim 1, wherein the vessel has one transfer port for feeding the liquefied ammonia and discharging the gaseous ammonia out of the vessel.

4. The liquefied ammonia charging method according to claim 1, comprising:
   feeding gaseous ammonia to a condenser,
   converting the gaseous ammonia into liquefied ammonia in the condenser,
   feeding the liquefied ammonia formed in the condenser to a vessel and cooling the vessel by the latent heat of vaporization of the liquefied ammonia,
   feeding the gaseous ammonia formed through vaporization of the liquefied ammonia to the condenser, and
   feeding the liquefied ammonia formed in the condenser to the vessel to thereby charge the vessel with the liquefied ammonia.

5. The liquefied ammonia charging method according to claim 4, wherein in the feeding of the gaseous ammonia to the condenser prior to the conversion to the liquefied ammonia, the gaseous ammonia feeding amount is metered with a mass flow meter.

6. The liquefied ammonia charging method according to claim 5, wherein the gaseous ammonia feeding amount is controlled in accordance with the data metered with the mass flow meter.

7. The liquefied ammonia charging method according to claim 4, further comprising discharging excessive gaseous ammonia out of the system.

8. The liquefied ammonia charging method according to claim 7, wherein the gaseous ammonia discharging amount is metered with a mass flow meter.

9. The liquefied ammonia charging method according to claim 4, wherein the gaseous ammonia liquefying speed in the condenser in the conversion to the liquefied ammonia is lower than the liquefied ammonia vaporization speed in the cooling.

10. The liquefied ammonia charging method according to claim 1, comprising:
    feeding gaseous ammonia to a condenser,
    converting the gaseous ammonia into liquefied ammonia in the condenser,
    feeding the liquefied ammonia formed in the condenser to the vessel to thereby charge the vessel with the liquefied ammonia,
    metering the total ammonia amount M1 existing inside the ammonia-charging apparatus and the ammonia amount M2 existing inside the ammonia-charging apparatus except the vessel, under the condition of stopping the running of the liquefied ammonia in and out of the vessel, and
    discharging the liquefied ammonia out of the vessel in an amount corresponding to the difference, M1−M2−MC, wherein MC is a programmed liquefied ammonia-charging amount in the vessel.

11. The liquefied ammonia charging method according to claim 10, wherein the total ammonia amount M1 existing inside the ammonia-charging apparatus is determined by metering the total ammonia amount (Min) fed into the ammonia-charging apparatus and the total ammonia amount (Mout) discharged out of the ammonia-charging apparatus, and computing the difference therebetween (Min−Mout).

12. The liquefied ammonia charging method according to claim 10, wherein the ammonia amount M2 existing inside the ammonia-charging apparatus except the vessel is metered with discharging the ammonia existing in the region of the ammonia-charging apparatus except the vessel, out of the ammonia-charging apparatus.

13. The liquefied ammonia charging method according to claim 10, wherein the ammonia-charging apparatus is equipped with a first mass flow meter for metering the gaseous ammonia-introducing amount into the apparatus.

14. The liquefied ammonia charging method according to claim 13, wherein the total ammonia amount (Min) fed into the ammonia-charging apparatus is metered with the first mass flow meter.

15. The liquefied ammonia charging method according to claim 10, wherein the ammonia-charging apparatus is equipped with a second mass flow meter for metering the gaseous ammonia discharging amount out of the apparatus.

16. The liquefied ammonia charging method according to claim 15, wherein the total ammonia amount (Mout) discharged out of the ammonia-charging apparatus is metered with the second mass flow meter.

17. The liquefied ammonia charging method according to claim 15, wherein the ammonia amount discharged out of the vessel is metered with the second mass flow meter.

18. The liquefied ammonia charging method according to claim 10, wherein in the feeding of the liquefied ammonia to the vessel, the vessel is cooled by the latent heat of vaporization of the liquefied ammonia with feeding the liquefied ammonia formed in the condenser into the vessel.

19. The liquefied ammonia charging method according to claim 18, wherein the gaseous ammonia formed through vaporization is discharged out of the ammonia-charging apparatus.

20. The liquefied ammonia charging method according to claim 18, wherein the gaseous ammonia formed through vaporization is circulated into the condenser.

21. The liquefied ammonia charging method according to claim 20, wherein gaseous ammonia is not additionally fed into the ammonia-charging apparatus during the circulation.

22. A method for producing nitride crystals, comprising:

charging a vessel containing a starting material therein, with liquefied ammonia according to the liquefied ammonia charging method of claim 1, and heating the vessel charged with liquefied ammonia to form nitride crystals.

23. The production method for nitride crystals according to claim 22, wherein the vessel is kept under from 20 to 500 MPa in the formation of the nitride crystals.

24. The production method for nitride crystals according to claim 22, wherein the vessel is heated up to from 150 to 800° C. in formation of the nitride crystals.

25. The production method for nitride crystals according to claim 22, further comprising adding at least one additive to the vessel.

* * * * *